United States Patent
Rieger et al.

(10) Patent No.: US 7,851,349 B2
(45) Date of Patent: Dec. 14, 2010

(54) METHOD FOR PRODUCING A CONNECTION ELECTRODE FOR TWO SEMICONDUCTOR ZONES ARRANGED ONE ABOVE ANOTHER

(75) Inventors: Walter Rieger, Arnoldstein (AT); Paul Ganitzer, Villach (AT); Oliver Haeberlen, Villach (AT); Franz Hirler, Isen (DE); Markus Zundel, Egmating (DE); Rudolf Zelsacher, Klagenfurt (AT); Erwin Bacher, Villach (AT)

(73) Assignee: Infineon Technologies Austria AG, Villach (AT)

( * ) Notice: Subject to any disclaimer, the term of this patent is extended or adjusted under 35 U.S.C. 154(b) by 280 days.

(21) Appl. No.: 11/527,743

(22) Filed: Sep. 26, 2006

(65) Prior Publication Data

US 2007/0093019 A1    Apr. 26, 2007

(30) Foreign Application Priority Data

Sep. 26, 2005   (DE) ................ 10 2005 045 909

(51) Int. Cl.
*H01L 21/283* (2006.01)
(52) U.S. Cl. .................. 438/620; 257/E21.159
(58) Field of Classification Search .......... 438/272, 438/309, 351, 597, 618, 621, 620; 257/E21.159
See application file for complete search history.

(56) References Cited

U.S. PATENT DOCUMENTS

| | | | | |
|---|---|---|---|---|
| 4,992,390 A | * | 2/1991 | Chang | .......... 438/270 |
| 6,737,323 B2 | * | 5/2004 | Mo | .......... 438/270 |
| 6,888,196 B2 | * | 5/2005 | Kobayashi | .......... 257/330 |
| 2001/0001494 A1 | * | 5/2001 | Kocon | .......... 257/328 |
| 2003/0186507 A1 | * | 10/2003 | Henninger et al. | .......... 438/270 |

FOREIGN PATENT DOCUMENTS

| | | |
|---|---|---|
| DE | 102 14 175 A1 | 10/2003 |
| DE | 103 61 715 A1 | 8/2005 |
| DE | 102004047237 A1 | 6/2006 |
| DE | 102004057237 A1 | 6/2006 |

\* cited by examiner

*Primary Examiner*—W. David Coleman
*Assistant Examiner*—Daniel Shook
(74) *Attorney, Agent, or Firm*—Maginot, Moore & Beck

(57) ABSTRACT

A method for producing a connection electrode for a first semiconductor zone and a second semiconductor zone includes producing a trench extending through the first semiconductor zone right into the second semiconductor zone in such a way that the first semiconductor zone is uncovered at sidewalls of the trench and the second semiconductor zone is uncovered at least at a bottom of the trench. The method also includes applying a protective layer to a first one of the first and second semiconductor zones in the trench, and producing a first connection zone in the second of the two semiconductor zones, which is not covered by the protective layer. The method further includes depositing an electrode layer at least onto the sidewalls and the bottom of the trench for the purpose of producing the connection electrode.

11 Claims, 17 Drawing Sheets

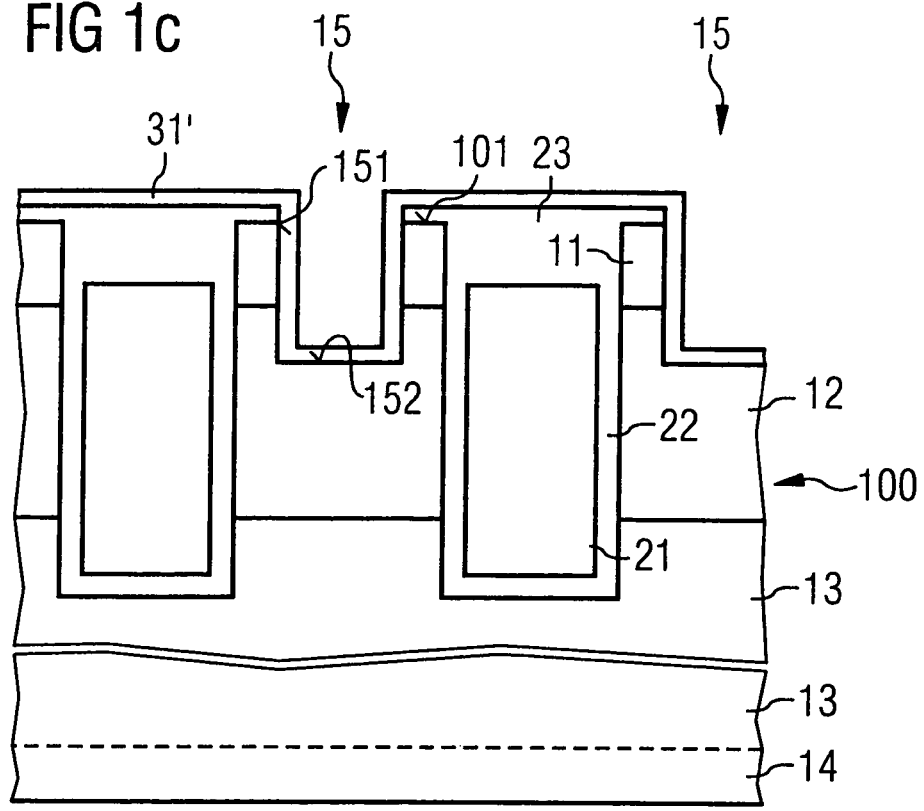
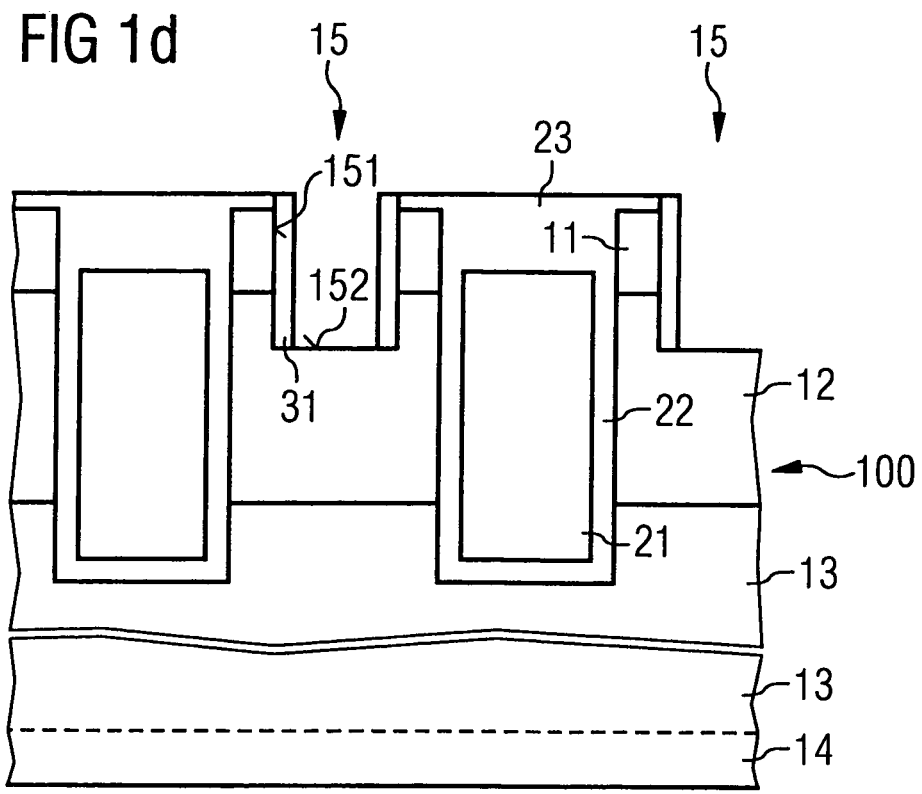

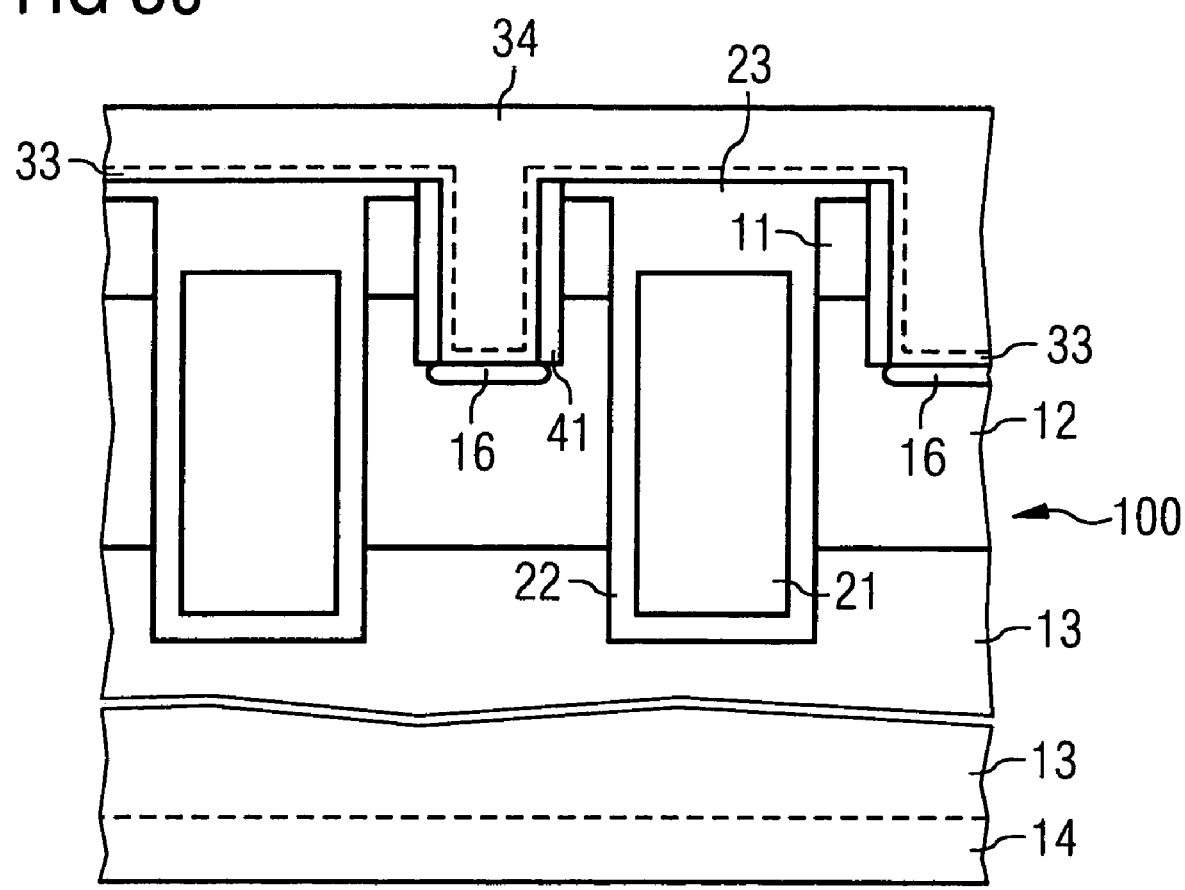

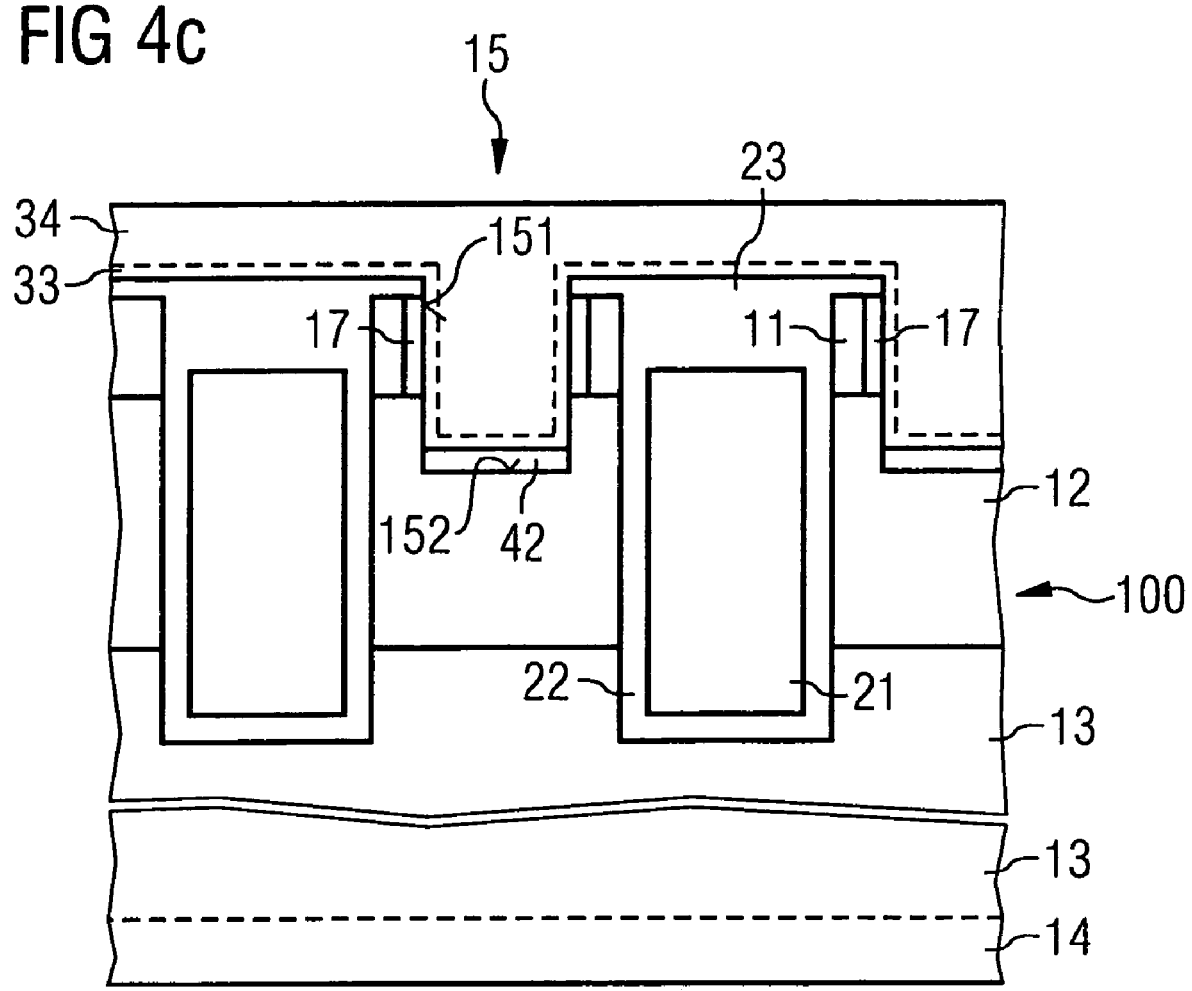

METHOD FOR PRODUCING A CONNECTION ELECTRODE FOR TWO SEMICONDUCTOR ZONES ARRANGED ONE ABOVE ANOTHER

BACKGROUND OF THE INVENTION

The present invention relates to a method for producing a connection electrode for two semiconductor zones which are arranged one above another and are doped complementarily with respect to one another, in particular a connection electrode for a source zone and a body zone of a power MOSFET.

In order to avoid negative effects of a parasitic bipolar transistor formed by the sequence of the drain or drift zone, the body zone and the source zone in the case of a power MOSFET, it is known in the case of power MOSFETs to short-circuit the body zone and the source zone. For this purpose, a source electrode connected to the source zone is realized in such a way that it also makes contact with the body zone and thereby short-circuits the source zone and the body zone.

In the case of so-called trench MOSFETs, in which the body zone and the source zone are arranged in a manner lying one above another in a semiconductor body and in which gate electrodes are arranged in trenches extending through the source zone and the body zone, it is known to arrange such a connection electrode in a trench extending into the semiconductor region (mesa region) between two gate trenches through the source zone right into the body zone.

SUMMARY OF THE INVENTION

In one exemplary embodiment of a method according to the invention for producing a connection electrode for a first semiconductor zone and a second semiconductor zone which are arranged one above another and are doped complementarily with respect to one another, provision is made firstly for producing a trench extending through the first semiconductor zone right into the second semiconductor zone in such a way that the first semiconductor zone is uncovered at sidewalls of the trench and the second semiconductor zone is uncovered at least at a bottom of the trench. Afterward, a protective layer is applied to one of the first and second semiconductor zones in the trench and a first connection zone is produced in the other semiconductor zone, which is not covered by the protective layer. Said connection zone is produced by introducing dopant atoms into said other semiconductor zone via the trench. In this case, said dopant atoms are chosen such that a first connection zone arises which is of the same conductivity type as said semiconductor zone not covered by the protective layer, but is doped more highly. Afterward, an electrode layer is applied to the sidewalls and to the bottom of the trench in order to produce the connection electrode.

In the case of this method, the task of the protective layer is to protect said one of the two semiconductor zones which is covered by the protective layer, which semiconductor zone is referred to hereinafter as protected semiconductor zone, against a doping by the dopant atoms which are introduced into the other of the two semiconductor zones, which is referred to hereinafter as unprotected semiconductor zone, via the trench for the purpose of producing the first connection zone. It is necessary to prevent said dopant atoms from being introduced into the protected semiconductor zone because the dopant atoms used for producing the first connection zone in the unprotected semiconductor zone are those dopant atoms which produce a semiconductor zone of a complementary conduction type with respect to the protected semiconductor zone. Said dopant atoms would thus reduce the net doping of the protected semiconductor zone in the region of the trench, and thus reduce the contact resistance between the connection electrode that is produced later and said protected semiconductor zone.

In the case of this method, the protective layer itself may be a layer containing dopant atoms, said dopant atoms being those dopant atoms which produce a semiconductor zone of the same conduction type as the protected semiconductor zone. The dopant atoms from said protective layer are indiffused into the protected semiconductor zone by at least said protected semiconductor zone being heated to a predetermined diffusion temperature for a predetermined time duration. As a result of this, a second connection zone, which is of the same conductivity type as the protected semiconductor zone itself, arises in the protected semiconductor zone. The temperature during the thermal process and the duration thereof are dependent on the type of dopant atoms used. Diffusion processes of this type are sufficiently known, so that further explanations in this respect can be dispensed with.

A first connection zone is produced for example by implanting dopant atoms into the unprotected semiconductor zone, that is to say the semiconductor zone not covered by the protective layer, via the trench. After the implantation of the dopant atoms, a thermal step is required, as is known, by means of which the implanted region is heated to a predetermined temperature for a predetermined time duration in order to anneal irradiation damage caused by the implantation and to activate the implanted dopant atoms, that is to say incorporate them into the crystal lattice of the semiconductor material used. This thermal step for activating the implanted dopant atoms may simultaneously be used as the thermal step for the indiffusion of the dopant atoms from the protective layer into the protected semiconductor zone. Depending on the type of dopant atoms present in the protective layer and depending on the type of implanted dopant atoms, however, it may also be necessary to carry out a thermal step as early as prior to the implantation of the dopant atoms for the purpose of producing the first connection zone, in order that the dopant atoms from the protective layer already partly indiffuse into the protected semiconductor zone.

The protective layer with the dopant atoms present therein may comprise an electrically conductive material, such as, for example, doped polysilicon, or a dielectric material, such as, for example, arsenosilicate glass (ASG), phosphosilicate glass (PSG) or borosilicate glass. The type of doping of the polysilicon or the selection of one of the glass materials explained above is effected depending on whether a p-doped or n-doped second connection zone is intended to be produced by means of the diffusion process.

In this case, an electrically conductive protective layer may remain prior to producing the connection electrode in the trench, while a dielectric, that is to say electrically insulating, protective layer has to be removed after the production of the first and second connection zones and prior to the production of the connection electrode.

A suitable protective layer is also a metal, such as, for example, titanium, which does not have a doping effect but which forms a metal-semiconductor compound with the surrounding semiconductor material when the thermal step is carried out, and thus provides for a low-resistance connection contact. When using silicon as semiconductor material for the two semiconductor zones, a silicide forms when using a metallic protective layer in the transition region between said protective layer and the semiconductor material of the protected semiconductor zone, said silicide providing for a low-resistance connection contact. A suitable material for the protective layer is titanium, for example.

The protective layer may be applied to the first semiconductor zone in the region of the sidewalls of the trench or to the second semiconductor zone in the region of the trench bottom.

The production of the first connection zone in the unprotected semiconductor zone not covered by the protective layer may also be effected by means of a diffusion method by the application of a layer containing dopant atoms in the trench at least onto the unprotected semiconductor zone and by the induffusion of dopant atoms from said layer into the unprotected semiconductor zone by means of a thermal process. In this case, the trench is preferably completely filled with the material containing the dopant atoms.

One alternative to the method explained above consists in producing the trench for the production of the connection electrode in two stages. In a first step, the trench is produced down to a first depth, which is smaller than the trench depth ultimately desired. After this first step, a first connection zone is produced in the first semiconductor zone, which is uncovered at sidewalls of said trench. Said first connection zone is produced for example by implantation of dopant atoms via the sidewalls of said first trench. The depth of said first trench may in this case be chosen such that the first trench still ends within said first semiconductor zone, but the trench may also already reach right into the second semiconductor zone. After the production of the first trench section, the trench is lengthened proceeding from its bottom in the direction of the second semiconductor zone. Dopant atoms are subsequently introduced via the bottom of the lengthened trench into the second semiconductor zone in order to produce a second connection zone there. During the production of the first connection zone in the first semiconductor zone, that region of the second semiconductor zone in which the second connection zone is to be produced is protected against a doping by the semiconductor section which is removed upon the lengthening of the trench in the direction of the second semiconductor zone.

A further alternative of the method according to the invention provides for producing, after the production of the trench, the first connection zone in the first semiconductor zone and the second connection zone in the second semiconductor zone by implantation of dopant atoms, these implantation steps being effected at different implantation angles chosen such that sections of the second semiconductor zone remain omitted from a doping during the production of the first connection zone in the first semiconductor zone, and that sections of the first semiconductor zone remain omitted from a doping during the production of the second connection zone in the second semiconductor zone. The production of the first connection zone in the first semiconductor zone, which is uncovered at sidewalls of the trench, is effected for example by implantation of dopant atoms at a first implantation angle chosen such that the dopant atoms do not pass as far as the bottom of the trench. The production of the second connection zone is effected for example by implantation of dopant atoms at an angle of 0° relative to the sidewalls of the trench, so that only dopant atoms are implanted via the bottom of the trench into the second semiconductor zone during this implantation step.

What is common to all three methods explained above for producing a connection electrode, which each comprise method steps for producing at least one highly doped connection zone, is that during the production of the at least one connection zone in one of the two semiconductor zones, the other of the two semiconductor zones is protected against a doping. This protection may be effected by applying a protective layer, by means of semiconductor sections that are initially present and are removed in the further course of the method, or by suitably setting the implantation angle during the implantation of dopant atoms.

BRIEF DESCRIPTION OF THE FIGURES

Exemplary embodiments of the present invention are explained in more detail below with reference to figures.

DETAILED DESCRIPTION OF THE FIGURES

In the figures, unless specified otherwise, identical reference symbols designate identical component regions with the same meaning.

The methods according to the invention are explained below for the production of a connection electrode which makes contact with a source zone and a body zone of a power MOSFET or power IGBT and thereby short-circuits these component zones. However, the methods according to the invention are not restricted to this application, but rather can be applied to the production of connection electrodes for arbitrary components having two semiconductor zones which are arranged one above another and are doped complementarily with respect to one another.

A first exemplary embodiment of a method according to the invention for producing a connection electrode which makes contact with two semiconductor zones doped complementarily with respect to one another, in which a protective layer is applied to one of the semiconductor zones during the method sequence, is explained below with reference to FIG. 1.

Figure 1A:
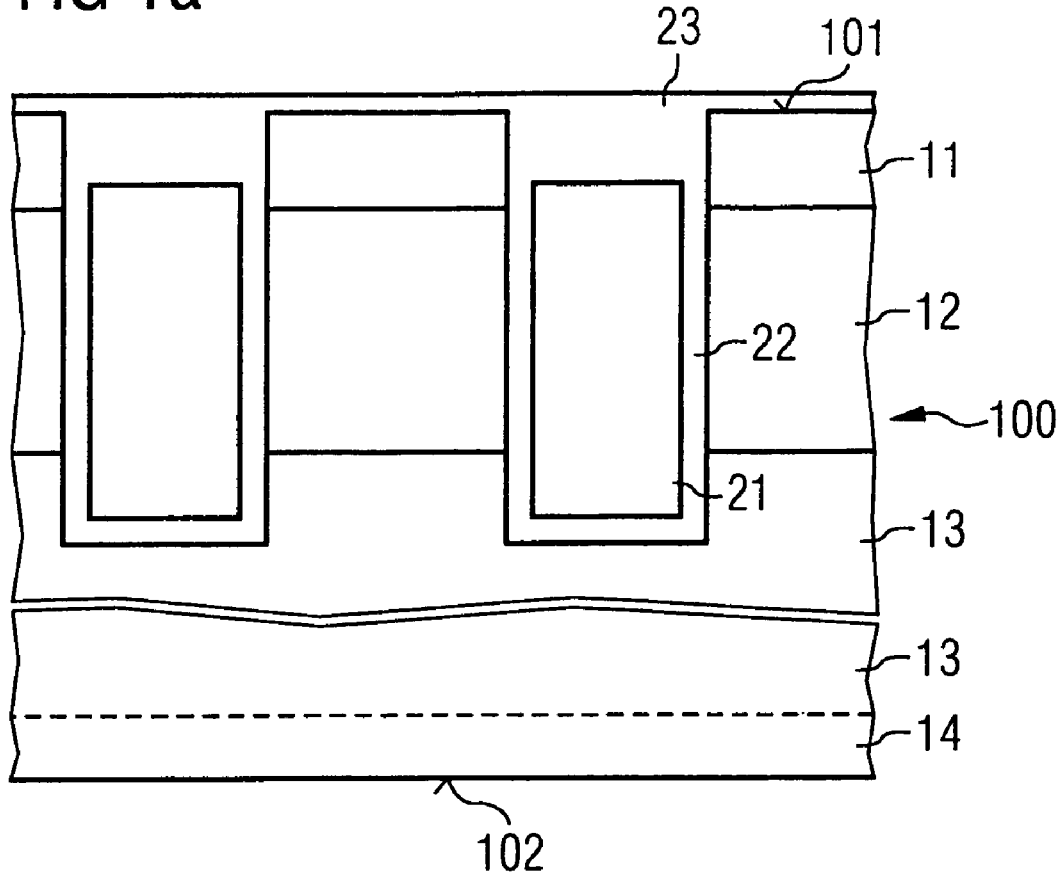
FIG. 1 illustrates, on the basis of cross-sectional illustrations of a semiconductor body having a first and a second semiconductor zone, a first exemplary embodiment of a method according to the invention for producing a connection electrode, in which a protective layer is applied to one of the two semiconductor zones, which remains on the respective semiconductor zone.

FIG. 1a shows in side view a cross section through a semiconductor body 100, in which a component structure for a power MOSFET is provided. This component structure comprises a first semiconductor zone 11 arranged in the region of a front side 101 of the semiconductor body, and a second semiconductor zone 12 adjacent to said first semiconductor zone 11 in the vertical direction, said second semiconductor zone being doped complementarily with respect to the first semiconductor zone 11. In the case of a MOSFET or IGBT, the first semiconductor zone 11 forms the source zone thereof and, in the case of a MOSFET or IGBT, the second semiconductor zone 12 forms the body zone thereof. The source zone 11 is n-doped in the case of an n-channel MOSFET, p-doped in the case of a p-channel MOSFET and usually n-doped in the case of an IGBT. The body zone 12 is in each case doped complementarily with respect to the source zone 11.

The second semiconductor zone 12 is arranged above a third semiconductor zone 13, which, in the case of a MOSFET and IGBT, forms the drift zone 13 thereof and which is in each case doped complementarily with respect to the second semiconductor zone 12. A highly doped connection zone 14 is adjacent to said third semiconductor zone 13 in the direction of a rear side 102 of the semiconductor body 100 opposite the front side 101, which connection zone 14 forms the drain zone of the MOSFET or IGBT and is of the same conduction type as the drift zone 13 in the case of a MOSFET and is doped complementarily with respect to the drift zone 13 in the case of an IGBT. This drain zone 14 may—as is illustrated by a dashed line in FIG. 1a—already be present prior to the production of the connection electrode yet to be explained. This connection zone 14 may be for example a highly doped semiconductor substrate, to which the drift zone 13, the body zone 12 and the source zone 11 are applied by means of an epitaxy method. However, the drain zone 14 may also be produced for example by means of an implantation method, in which dopant atoms are implanted via the rear side 102 into the semiconductor body 100, after the production of the connection electrode or during implantation steps yet to be explained during the production of the connection electrode.

A gate electrode, two electrode sections 21 of which are illustrated in FIG. 1a, extends in the vertical direction proceeding from the first semiconductor zone 11 through the second semiconductor zone 12 right into the third semiconductor zone 13 and is insulated from the semiconductor zones 11, 12, 13 of the semiconductor body 100 by means of a dielectric 22. In the direction of the front side 101, the gate electrode is preferably covered by a thicker dielectric layer 23, which also extends in sections over the first semiconductor zone 11 above the front side 101 of the semiconductor body. It should be pointed out in this connection that the illustration of the layer thicknesses in the figures is not true to scale. Thus, in particular, that section of the insulation layer which extends over the first semiconductor zone 11 may also be embodied thicker than illustrated.

The aim of the method according to the invention is to produce a connection electrode which makes low-resistance contact with the first and second semiconductor zones 11, 12, but during the production of which the doping concentrations of the first and second semiconductor zones 11, 12 is not altered in a region directly adjacent to the gate dielectric 22, since this would lead to a change in the electrical properties of the trench MOSFET, in particular to a shift in the threshold voltage.

Figure 1B:
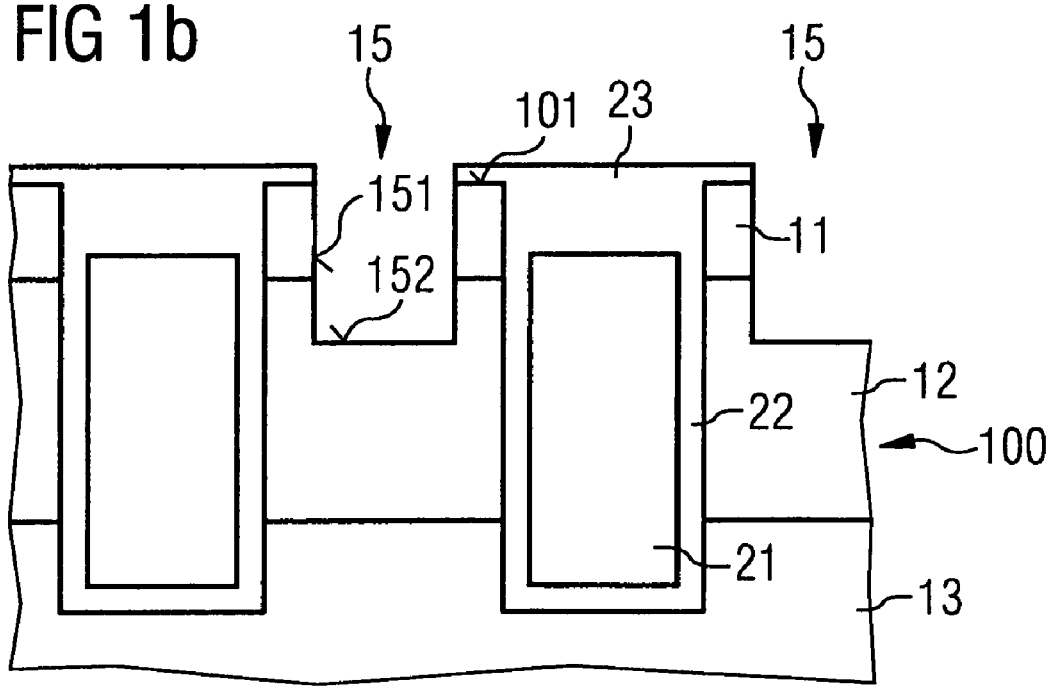

In first method steps, the result of which is illustrated in FIG. 1b, provision is made for producing a trench 15 in the mesa region between two trenches having gate electrode sections 21 arranged therein, which trench extends through the dielectric layer 23 and the first semiconductor zone 11 right into the second semiconductor zone 12. Said trench 15 is arranged in a manner spaced apart in the lateral direction from the trenches having the gate electrode C sections 21. It should be pointed out that the production of the connection electrode is explained below only with reference to one electrode section which is arranged between two trenches having gate electrode sections arranged therein. In a power MOSFET having a cell array having a multiplicity of gate electrode sections 21 arranged in a manner spaced apart from one another, such connection electrodes are preferably produced in each mesa region between two gate electrode sections 21.

The trench 15 has sidewalls 151 and a bottom 152. The first semiconductor zone 11 is uncovered at the sidewalls 151 of this trench 15 after the production thereof. The second semiconductor zone 12 is uncovered at the bottom of the trench 152 and in sections also at the sidewalls of the trench 151 because the trench 15, proceeding from the first side 101, extends to below the interface between the first and second semiconductor zones 11, 12. The trench 15 is produced for example by means of a sufficiently known anisotropic etching method using a mask that leaves the region of the trench free during the etching process.

In next method steps, which are illustrated in FIGS. 1c and 1d, a protective layer 31 is produced in the trench 15, said protective layer completely covering one of the two first and second semiconductor zones 11, 12 within the trench. Referring to FIG. 1c, for this purpose a protective layer 31' is deposited over the whole area, said protective layer covering the front side 101 of the semiconductor body 100 and also the side walls 151 and the bottom 152 of the trench 15. The deposition of said protective layer 31' may be effected for example by means of a CVD method (CVD=chemical vapor deposition).

In next method steps, the result of which is illustrated in FIG. 1d, said protective layer is removed at least from the bottom 152 of the trench 15, thereby giving rise to a protective layer 31 at the sidewalls 151 of the trench 15, said protective layer completely covering the first semiconductor zone 11 within the trench. The protective layer 31 also covers in sections the second semiconductor zone 12 at the sidewalls of the trench, but leaves the second semiconductor zone 12 free at the bottom of the trench 52. The production of said protective layer 31 at the sidewalls 152 of the trench is effected for example by anisotropically etching back the protective layer 31'. During this anisotropic etching method, the protective layer 31' is removed both above the front side 101 of the semiconductor body and from the bottom of the trench 152.

Figure 1E:
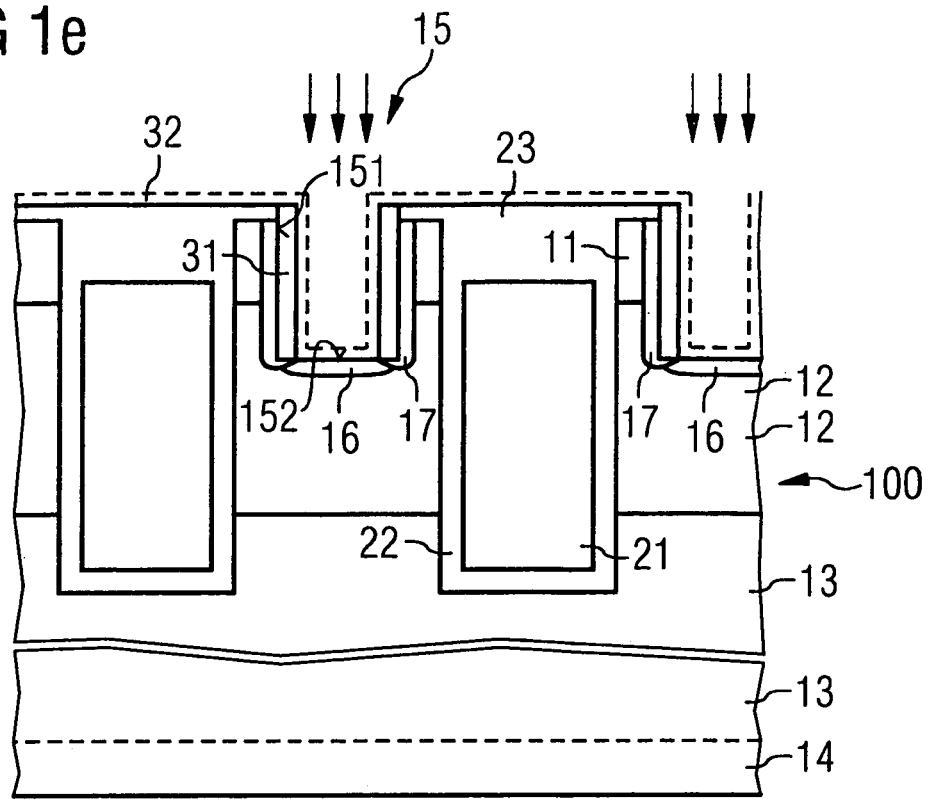

During next method steps, which are illustrated in FIG. 1e, a first connection zone 16 is produced below the trench bottom 152 in the second semiconductor zone 12. Said first connection zone 16 is of the same conductivity type as the second semiconductor zone 12, but doped more highly. It is assumed for the explanation below that the first semiconductor zone 11 is doped with dopant atoms of a first conductivity type, which are referred to hereinafter as dopant atoms of the first type, and that the second semiconductor zone 12 is doped with dopant atoms of a second conductivity type complementary to the first conductivity type, which are referred to hereinafter as dopant atoms of the second type.

In order to produce the first connection zone 16, dopant atoms of the second type are implanted via the bottom 152 of the trench 15 into the second semiconductor zone 12. The thicker dielectric layer arranged above the gate electrode 21, which dielectric layer is also arranged in sections above the first semiconductor zone 11 and extends as far as the trench 15 in the lateral direction, during this implantation step 16, protects the first semiconductor zone 11 in the region below the front side 101 against an implantation with dopants of the second type. Within the trench 15, the protective layer 31 at the trench sidewalls 151 protects the first semiconductor zone 11 against a doping with dopant atoms of said second type.

Preferably, prior to carrying out the implantation step, a screen oxide 32 is applied to the trench bottom 152, but it may, in particular, also be deposited over the whole area. Said screen oxide 32 serves for scattering the dopant atoms implanted for the production of the first connection zone 16.

In the example illustrated, the protective layer 31 is a layer doped with dopant atoms of the first type. In the course of carrying out a thermal process, in which the semiconductor body 100 is heated to a predetermined diffusion temperature for a predetermined time duration at least in the region of the first semiconductor zone 11, said dopant atoms of the first type indiffuse from the protective layer 31 into the first semiconductor zone 11, where they produce a second connection zone 17, which is of the same conduction type as the first semiconductor zone 11, but is doped more highly. The temperature of this diffusion process is between 800° C. and 1100° C. for a duration of between 10 seconds and 15 minutes. The duration is dependent, inter alia, on the choice of dopant. Whereas boron and phosphorus, for example, diffuse comparatively rapidly, with the result that a shorter diffusion duration is to be set, arsenic diffuses comparatively slowly and requires longer diffusion durations.

In order to produce the first connection zone 16, after the implantation of the dopant atoms of the first type, a thermal step is likewise required in order to anneal irradiation damage and to activate the implanted dopant atoms, that is to say incorporate them into the crystal lattice of the semiconductor body 100. Depending on which elements are used as dopant atoms of the first type and as dopant atoms of the second type, a single thermal step may be sufficient both for activating the implanted dopant atoms of the second type and for indiffusing the dopant atoms of the first type from the protective layer 31 into the first semiconductor zone 11. If the diffusion temperature of the dopant atoms of the first type which serve for producing the second connection zone 17 should be higher than the activation temperature required for activating the dopant atoms of the second type, there is the possibility of carrying out, prior to the implantation of the dopant atoms of the second type, a thermal step by means of which the dopant atoms of the first type are implanted into the first semiconductor zone 11. Only afterward are the dopant atoms of the second type implanted and activated by means of a further thermal step in order to produce the second connection zone 16. The activation temperatures lie within the range of the abovementioned diffusion temperatures (800° C. to 1100° C.). The activation durations may lie within the range of the abovementioned diffusion durations (15 seconds to 15 minutes).

The protective layer 31 with the dopant atoms of the first type contained therein may be an electrically conductive layer, such as, for example, doped polysilicon, but may also be an electrically insulating layer, such as, for example, a silicate glass. By way of example, polysilicon doped with arsenic or phosphorus, or else phosphosilicate glass (PSG) or arsenosilicate glass (ASG) is suitable for producing an n-doped second connection zone 17. For producing a p-doped second connection zone 17, polysilicon doped with boron or borosilicate glass (BSG) is suitable as the protective layer 31.

The screen oxide layer 32 not only serves for scattering the dopant atoms implanted into the trench bottom 152 but also has the function of preventing, during the diffusion method, dopant atoms of the first type from passing from the protective layer 31 into the atmosphere prevailing in the trench and from indiffusing from said atmosphere into the trench bottom 152, where they would reduce the net doping of the first connection zone 16 with dopant atoms of the second conduction type and thus increase the contact resistance between said first connection zone 16 and the connection electrode yet to be produced.

After the production of the first and second connection zones 16, 17 and prior to the production of said connection electrode 34, the screen oxide layer 32 is removed, for example by means of an etching method. If the material of the protective layer 31 is a dielectric material, such as, for example, silicate glass, said protective layer 31 must likewise be removed, whereas an electrically conductive protective layer 31, such as, for example, doped polysilicon, can remain.

Figure 1F:
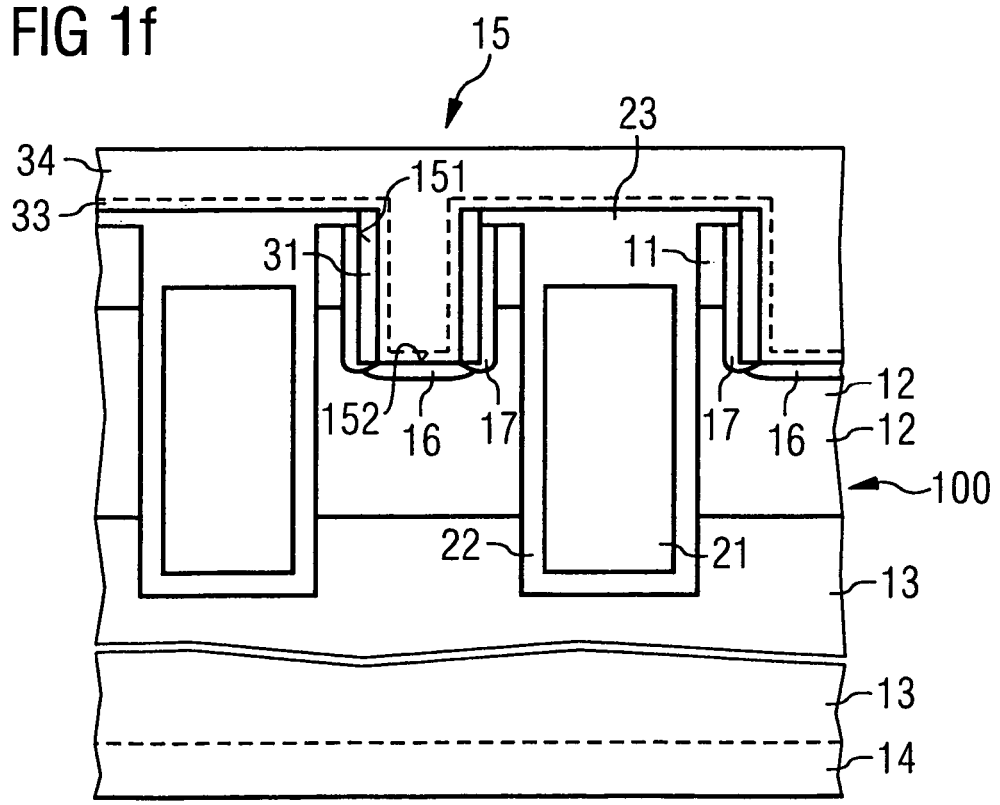

FIG. 1*f* shows the component after method steps for removing the screen oxide 32 and for producing a connection electrode 34. In this case, the protective layer 31, which is an electrically conductive layer 31 in the example illustrated, remains on the sidewalls 151 of the trench. The connection electrode 34 is produced by applying an electrode layer to the sidewalls and the bottom of the trench, the trench 15 preferably being completely filled with electrode material. Prior to the deposition of the electrode layer, a barrier layer 33 is preferably applied, which barrier layer is electrically conductive and comprises titanium (Ti) for example. Said barrier layer may fulfill various functions: thus, the barrier layer 33 may protect the semiconductor material in the trench against contamination during the production processes for the production of the connection electrode 34. This is necessary particularly when a connection electrode made of tungsten (W) is produced. Furthermore, the barrier layer 33 may fulfill the function of a contact layer which short-circuits the connection zones 16, 17 which are doped complementarily with respect to one another. This contact function of the barrier layer is necessary for example when the connection electrode 34 is produced from highly doped polysilicon. In the case of producing the connection electrode from an aluminum-copper compound, the barrier layer prevents "spiking".

A barrier layer may be dispensed with if AlCu(Si), for example, is used as material for the connection electrode.

The result of the production method explained above is a semiconductor component comprising a first and a second semiconductor zone 11, 12, which are doped complementarily with respect to one another and with which low-resistance contact is made by means of a connection electrode 34. The low-resistance contact becomes possible by means of the two highly doped connection zones 16, 17 and, in the region of the first semiconductor zone 11, by means of the highly doped protective layer 31, comprising polysilicon for example.

Figure 2:
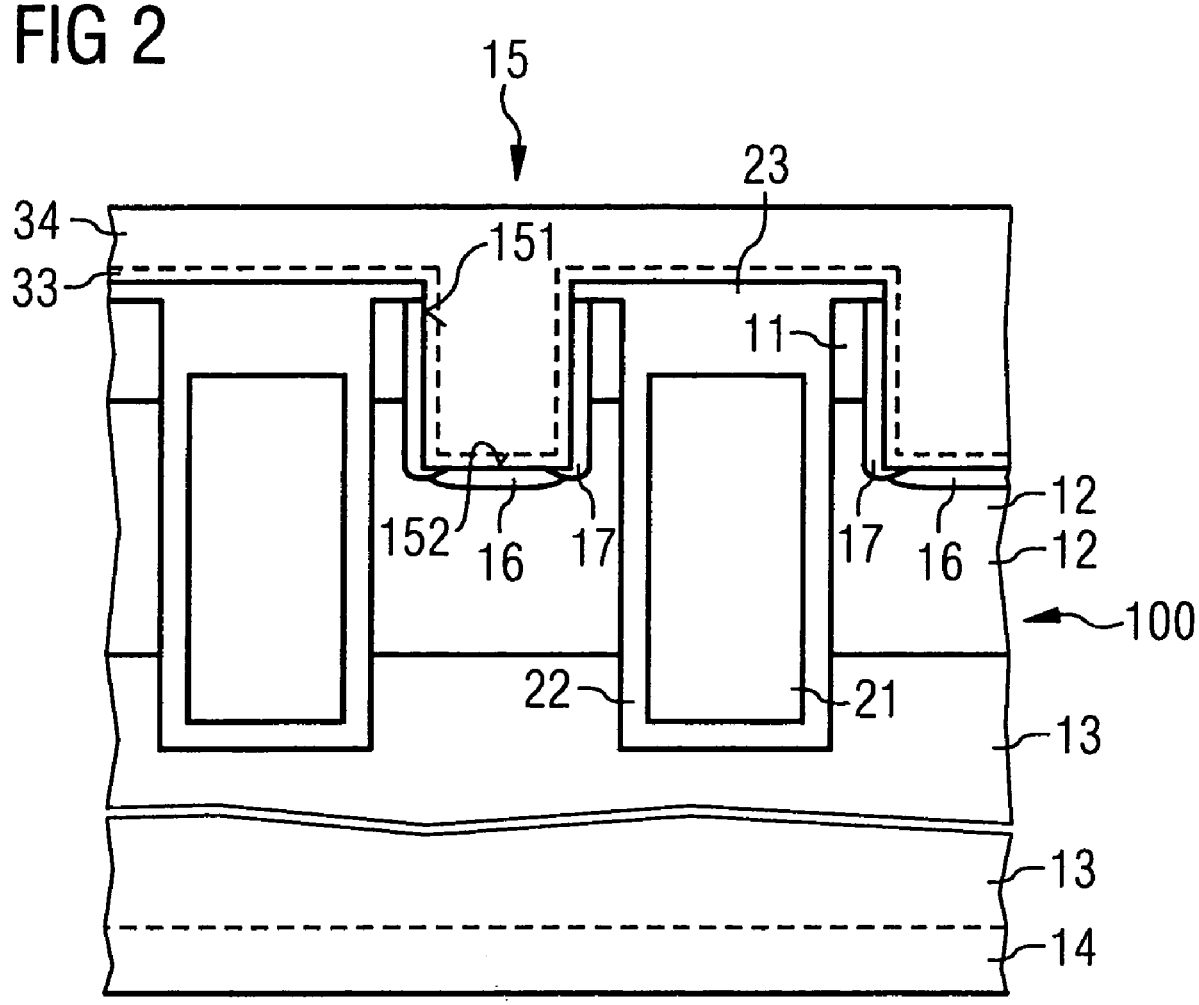
FIG. 2 shows a cross-sectional illustration of a semiconductor component produced by a modified method with respect to the method according to FIG. 1, in which the protective layer is removed.

FIG. 2 shows a cross section through the component after the production of the connection electrode 34 and the optional barrier layer 33, here the protective layer having been removed at the sidewalls of the trench. The removal of the protective layer 31 may be effected for example together with the removal of the screen oxide layer (32 in FIG. 1*e*). Customary etching materials which are suitable for etching the screen oxide layer 32 usually also etch silicate glass, which is appropriate as protective layer, so that the screen oxide layer 32 and the protective layer 31 are removed in a common method step. In the case of the component illustrated in FIG. 2, the connection electrode comprising the optional barrier layer 33 and the electrode layer 34 directly makes contact with the highly doped second connection zone 17 in the region of the sidewalls of the trench.

A further method for producing a connection electrode which makes contact with the first and second semiconductor zones 11, 12 with the use of a protective layer is explained below with reference to FIGS. 3a to 3c.

Figure 3A:
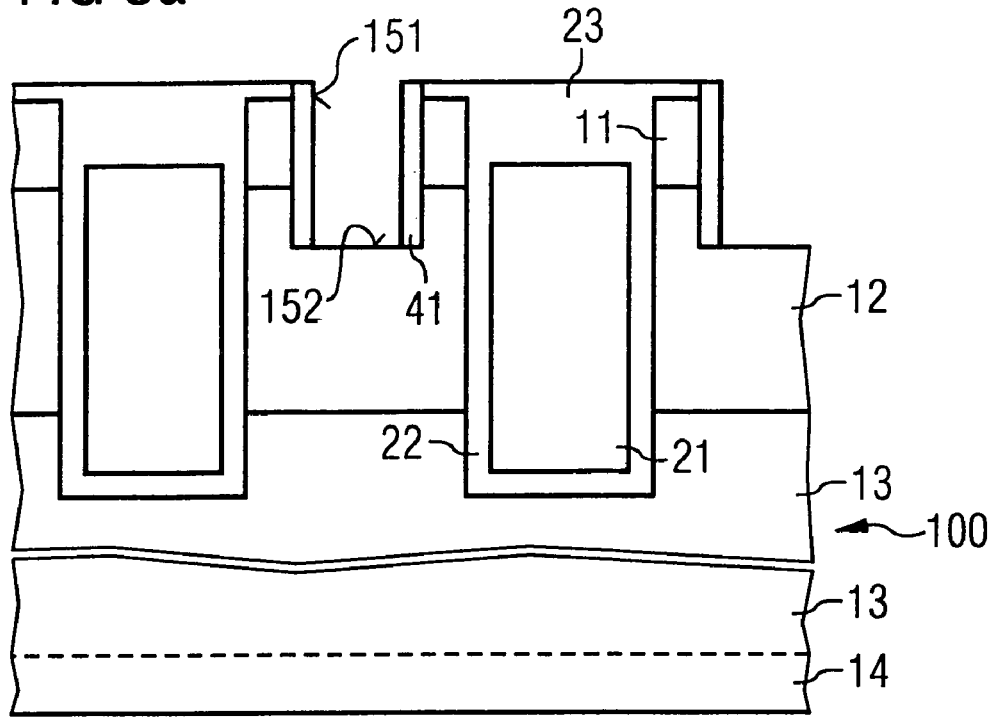
FIG. 3 illustrates, on the basis of cross-sectional illustrations of a semiconductor body during different method steps, a second exemplary embodiment of a method for producing a connection electrode, in which a protective layer is applied to one of the two semiconductor zones.

Referring to FIG. 3a, in this method, after the production of the trench 15, a metallic protective layer 41 is applied to the sidewalls 151 of the trench 15. The production of said metallic protective layer 41 is effected for example according to the production of the protective layer 31 illustrated in FIG. 1d by the deposition of a metallic layer and subsequent anisotropic etching back of said metallic layer, with the result that a protective layer 41 remains at the sidewalls 151 of the trench 15.

Figure 3B:
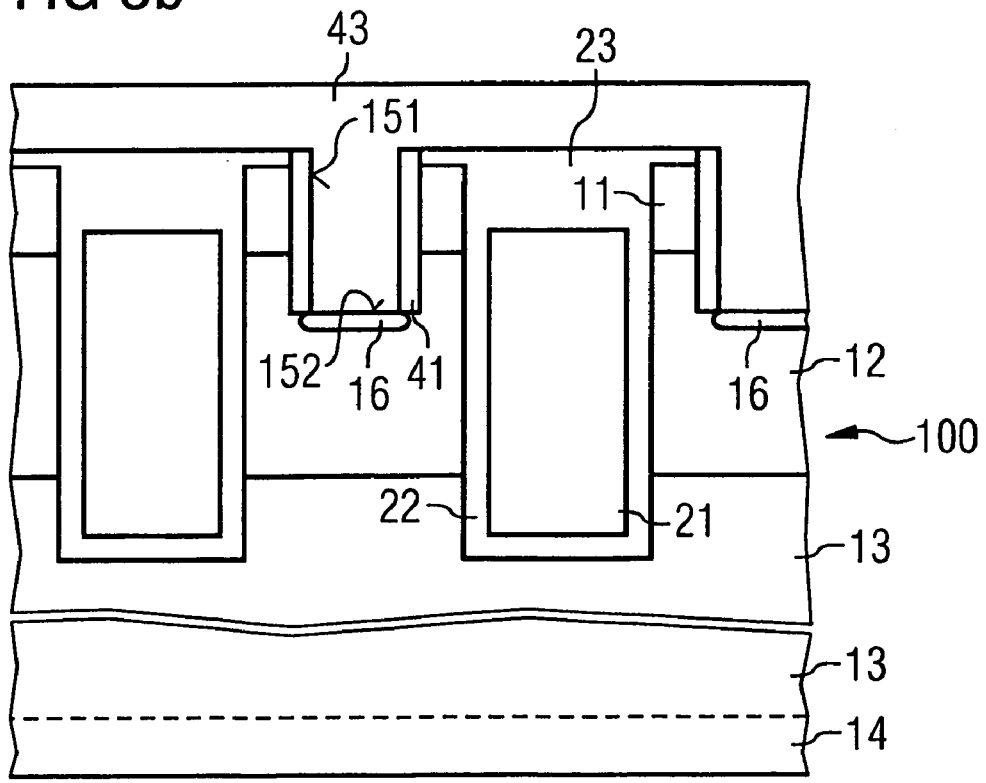

Referring to FIG. 3b, subsequently, a dopant material 43 containing dopant atoms of the second type is introduced into the trench 15. Said material 43 containing dopant atoms is doped polysilicon, for example. Said dopant material 43 must at least partly fill the trench, so that the bottom 152 of the trench is covered, although this dopant material layer may also be deposited in such a way that the trench 15 is completely filled with dopant material 43 and that regions of this dopant material layer 43 are also arranged above the front side of the semiconductor body 101 as well, as is illustrated in FIG. 3b.

The production of said dopant material layer 43 is followed by a diffusion step, in which the semiconductor body 100 is heated to a diffusion temperature for a predetermined time duration, so that dopant atoms indiffuse from the dopant material layer 43 at the bottom 152 of the trench into the second semiconductor zone 12, where they produce a highly doped first connection zone 16 of the second conduction type. The protective layer 41 at the trench sidewalls 151 serves as a diffusion barrier and protects the first semiconductor zone 11 during the diffusion method against an indiffusion of dopant atoms of the second conduction type into said first semiconductor zone 11. In the boundary region between the protective layer 41 and the semiconductor material, a metal-semiconductor compound arises during the diffusion process and ensures a low-resistance connection contact between the metallic protective layer 41 and, in particular, the first semiconductor zone 11. When silicon is used as semiconductor material, said metal-semiconductor compound is a silicide. Titanium, in particular, is suitable as material for the metallic protective layer.

After the production of the connection zone 16 below the trench bottom in the second semiconductor zone 12, the dopant material layer 43 is removed, for example by means of an etching method. The connection electrode 34 is subsequently produced by depositing an electrode material layer onto the sidewalls 151 and the bottom 152 of the trench 15, a barrier layer 33 optionally being applied at least to the trench bottom 152 and the sidewalls 151 of the trench prior to the deposition of the electrode layer. The dopant material layer may comprise an electrically conductive material, such as, for example, doped polysilicon. In a manner not illustrated in any greater detail, such an electrically conductive dopant material layer may remain at least in sections in the trench and fulfill the function of the connection electrode there. There is thus the possibility, for example, of etching back such an electrically conductive dopant material layer after the indiffusion of the dopant atoms into the semiconductor body 100 to an extent such that the is still at least partly filled with the dopant material layer, and of subsequently producing an electrode layer, for example made of aluminum, which forms a further part of the connection electrode and makes contact with the dopant material layer.

Such an electrode layer may also be applied to the dopant material layer 34 illustrated in FIG. 3c directly, that is to say without a previous etching process, if said layer comprises an electrically conductive material.

Figure 4A:
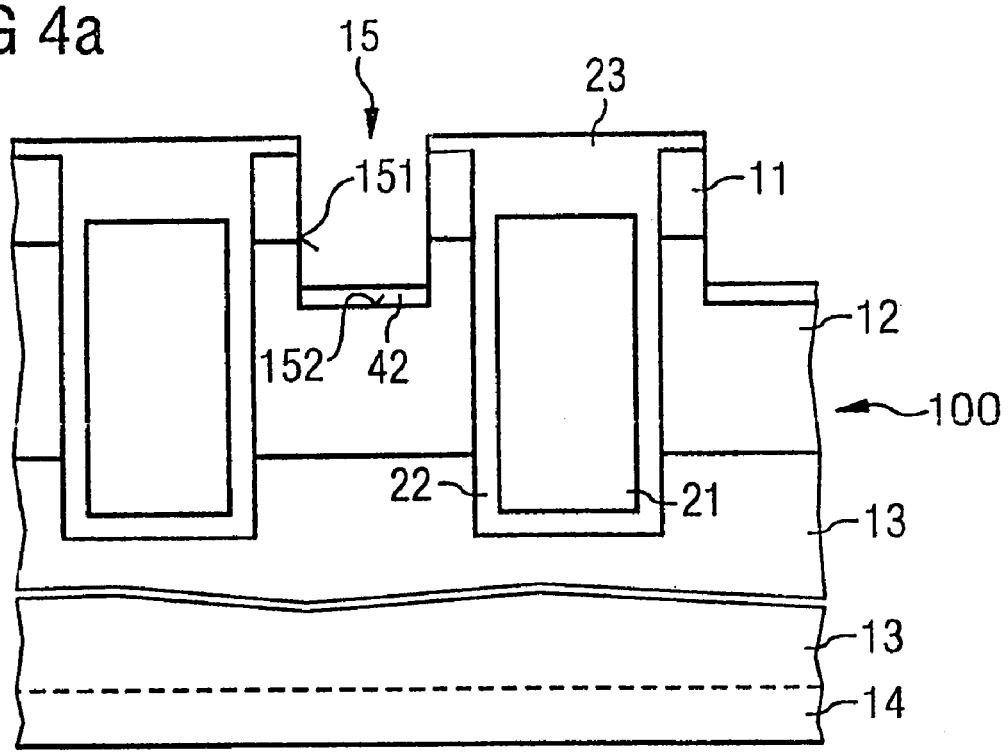
FIG. 4 illustrates, on the basis of cross-sectional illustrations of a semiconductor body, a third exemplary embodiment of a method for producing a connection electrode, in which the protective layer is applied to one of the two semiconductor zones to be contact-connected.
Figure 4B:
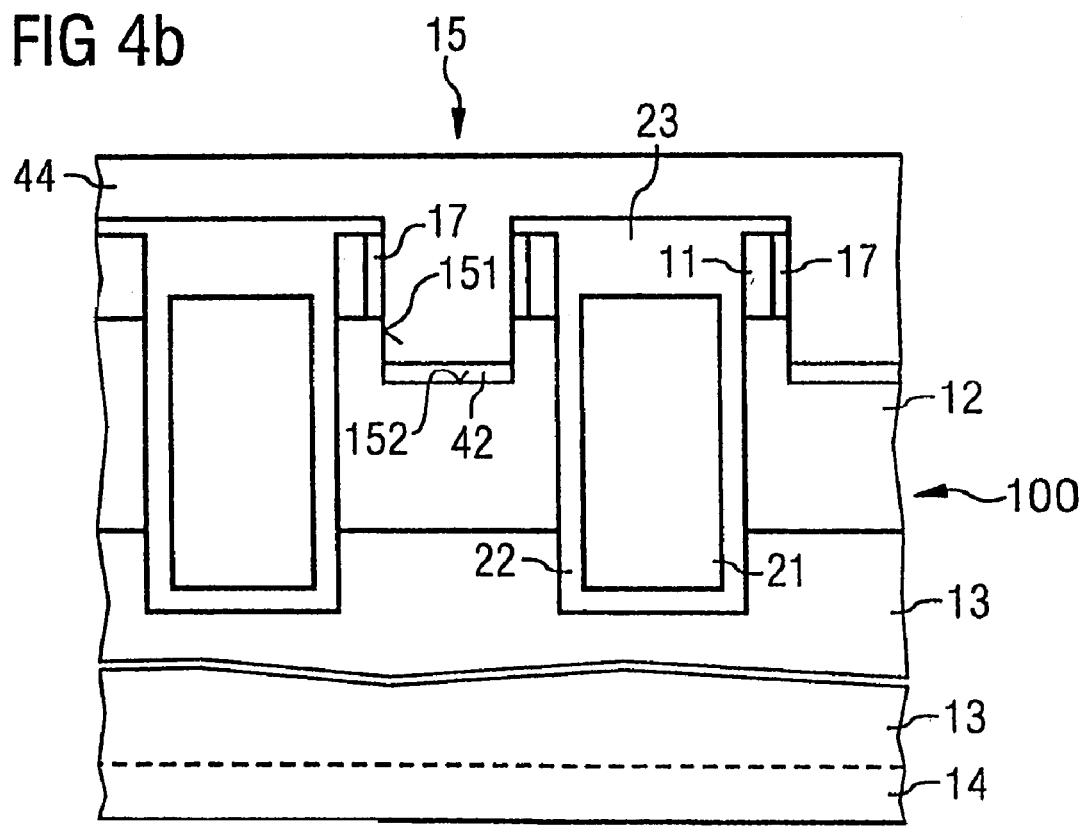

FIGS. 4a to 4c explained below show a modification of the method explained above with reference to FIGS. 3a to 3c. In this method, after the production of the trench 15, a metallic protective layer 42 is applied to the trench bottom 152, while the trench sidewalls remain free. The protective layer 42 comprises for example a silicide, such as titanium silicide or cobalt silicide. Such a protective layer may be produced by highly nonconformal sputtering of a metal, such as titanium or cobalt, and a subsequent nonconformal self-aligned TiSi process. During this nonconformal deposition by sputtering, the metal is applied to the bottom 151 of the trench 15 and to the insulation layer 23, but not to the sidewalls 152 of the trench. A thermal process is subsequently carried out, by means of which the metal at the trench bottom 151 reacts with the silicon of the semiconductor body 100 to form a silicide and forms the protective layer there, while the metal on the insulation layer does not react. The metal remaining on the insulation layer 23 is subsequently removed wet-chemically.

After the production of this protective layer 42 at the trench bottom 152, the trench 15 is filled at least as far as an upper edge of the second semiconductor layer 11, but preferably completely, with a dopant material layer 44 having dopant atoms of the same conduction type as the first semiconductor zone 11, that is to say dopant atoms of the first type. Said dopant material layer 44 is a doped polysilicon layer, for example. After the production of said dopant material layer 44, a diffusion process is effected, in which the semiconductor body is heated to a diffusion temperature for a predetermined time duration, as a result of which dopant atoms indiffuse from the dopant material layer 44 via the sidewalls 152 of the trench 15 into the first semiconductor zone 11, where they form a highly doped connection zone 17 of the same conduction type as the first semiconductor zone 11. The dopant atoms are phosphorus atoms or arsenic atoms, for example, if an n-doped connection zone 17 is to be produced, and the dopant atoms are boron atoms, for example, if a p-doped connection zone 17 is to be produced.

After the conclusion of the diffusion method, the dopant material layer 44 is removed and an electrode material is applied to the sidewalls and the bottom of the trench, or the trench is completely filled with an electrode material, as is illustrated as the result in FIG. 4c. A barrier layer 33, for example made of titanium, is optionally applied at least to the sidewalls and the bottom of the trench prior to the deposition of the electrode layer 34.

An alternative method for producing a connection electrode which makes contact with the first and second semiconductor zones 11, 12 is explained below with reference to FIGS. 5a to 5d.

Figure 5A:
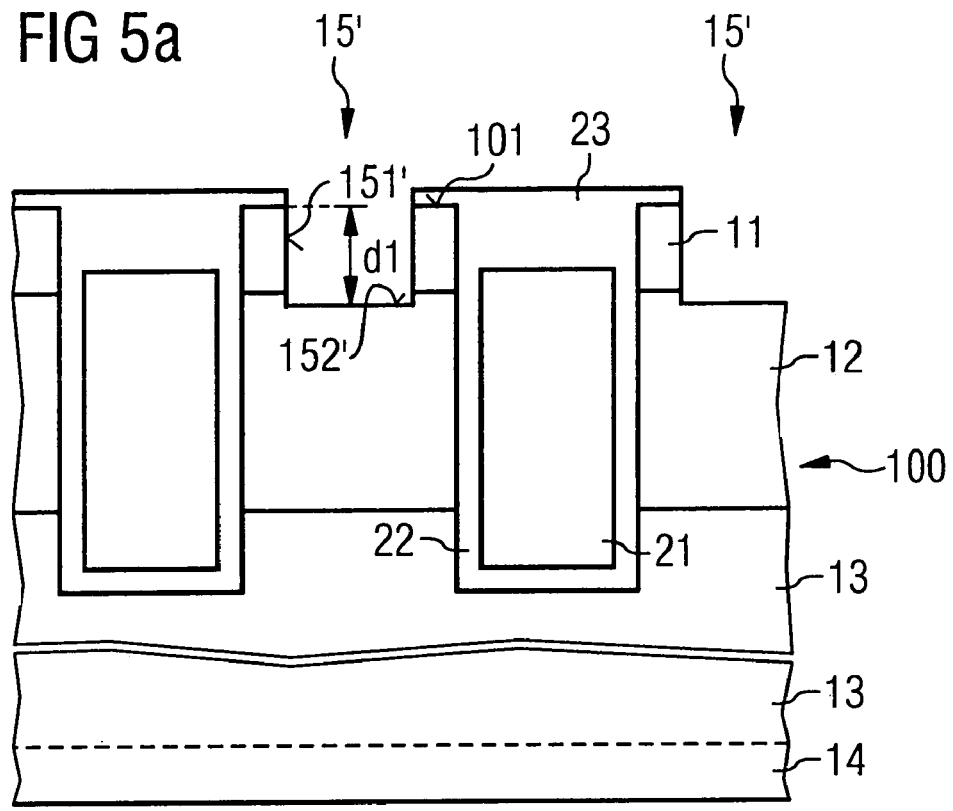
FIG. 5 illustrates, on the basis of cross-sectional illustrations of a semiconductor body having a first and a second semiconductor zone to be contact-connected, a method for producing a connection electrode in which a trench for the connection electrode is produced in two stages.

Referring to FIG. 5a, this method involves firstly producing a trench 15' extending through the dielectric layer 23 via the front side 101 down to a first trench depth d1 into the semiconductor body 100, said first trench depth d1 being smaller than the ultimately desired depth of the trench. In the example in FIG. 5a, this first trench section 15' extends right into the second semiconductor zone 12, but may—in a manner not specifically illustrated—also end above said second semiconductor zone 12 in the first semiconductor zone 11.

Figure 5B:
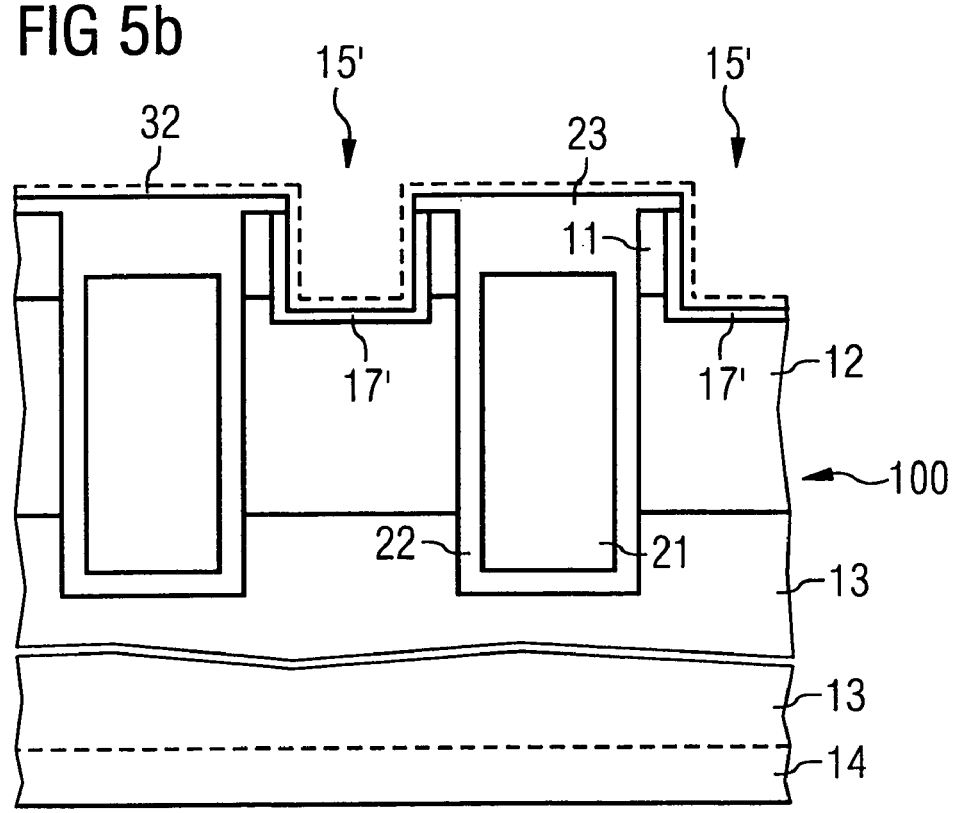

Said first trench section 15' has sidewalls 151' and a bottom 152'. Referring to FIG. 5b, dopant atoms are introduced via the sidewalls 151' and the bottom 152' into the first and second semiconductor zones 11, 12 in order to produce a highly doped connection zone of the same conductivity type as the first semiconductor zone 11. For this purpose, dopant atoms of the first type are implanted into the first semiconductor zone 11 via the sidewalls 151', for example. In this case, the dopant atoms are also implanted into the second semiconductor zone 12 via the bottom 152 of the trench 15'. The semiconductor region arranged adjacent to the sidewalls 151 and the bottom 152 of the trench and having dopant atoms of the first type implanted therein is designated by the reference symbol 17' in FIG. 5b. For carrying out this implantation method, a screen oxide 32 is optionally applied at least to the sidewalls 151' and the bottom 152' of the trench 15.

Instead of carrying out an implantation method, the doped semiconductor zone 17' may also be produced by means of a diffusion method by the trench section 15'—in a manner that is not specifically illustrated—being filled with a material containing dopant atoms and by dopant atoms subsequently being indiffused from said material into the first and second semiconductor zones 11, 12 during a thermal step.

Figure 5C:
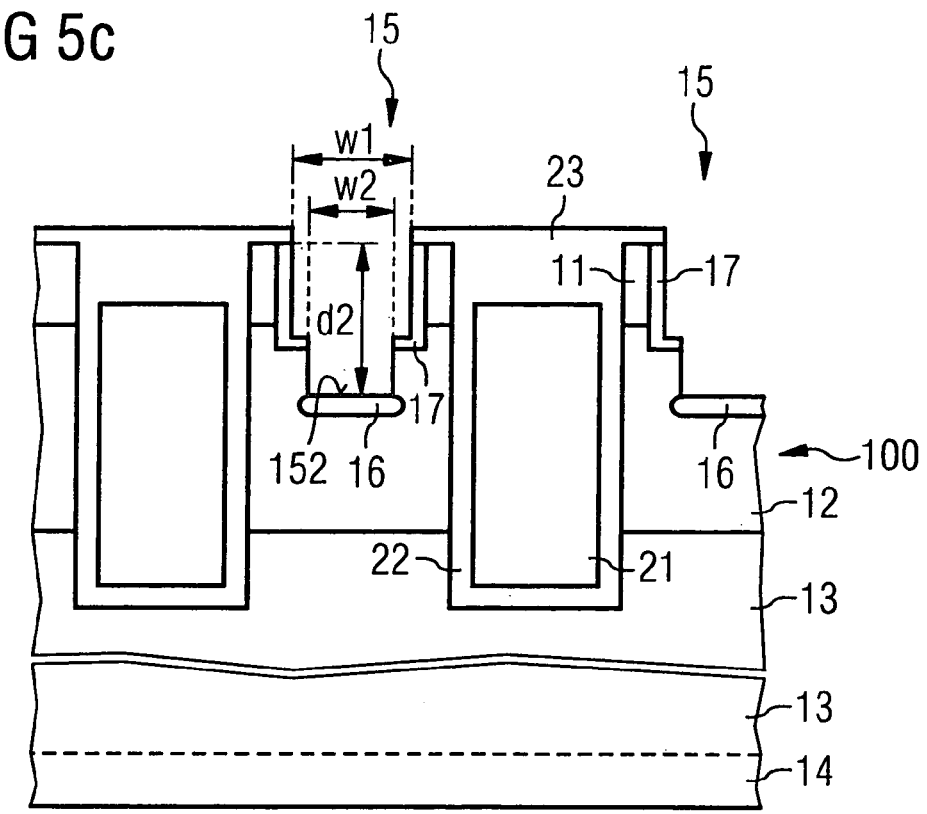

During next method steps, the result of which is illustrated in FIG. 5c, the trench is etched in the direction of the second semiconductor zone 12 down to a desired end depth d2 by means of an etching method. If a screen oxide 32 was applied for the method steps explained with reference to FIG. 5b, said screen oxide is firstly removed anisotropically from the bottom 152' of the trench section 15', whereas said screen oxide remains—in a manner not specifically illustrated—on the sidewalls 151' of the trench section 15'. In this case, the further trench section which is produced by the etching method and extends further into the semiconductor body proceeding from the bottom 152' of the first trench section 151 has a smaller width w2 than the first trench section 15', which has a width w1.

After the trench has been lengthened down to its desired end depth d2, dopant atoms are implanted into the second semiconductor zone 12 via the bottom 152 of the trench 15 in order to produce a highly doped connection zone 16 of the same conduction type as the second semiconductor zone 12. After the implantation of these dopant atoms, a thermal step is required, in a manner already explained, in order to anneal irradiation damage and to activate the implanted dopant atoms. In this case, a common thermal step may be sufficient for activating the dopant atoms of the first type implanted into the region 171 and for activating the dopant atoms of the second type implanted via the bottom 152 of the trench. As a result, this gives rise to a highly doped connection zone 16 of the same conduction type as the second semiconductor zone 12 at the bottom of the trench produced in two stages and a highly doped connection zone 17 of the same conduction type as the first semiconductor zone 11 at sidewalls of the initially produced trench section 151 of the trench produced in two stages.

Figure 5D:
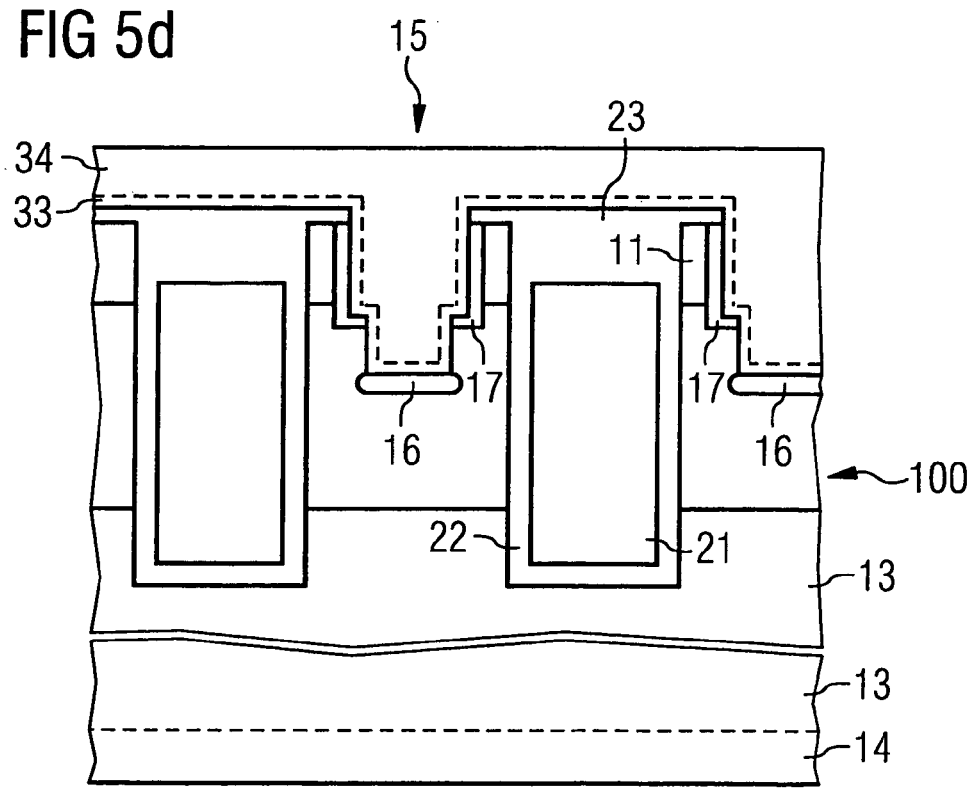

These method steps for producing the connection zones 16, 17 are followed by method steps for producing the connection electrode. The result of these method steps is illustrated in FIG. 5d. For producing the connection electrode, as in the method already explained previously, an electrode layer is deposited onto the sidewalls and the bottom of the trench, the trench preferably being completely filled with electrode material. Furthermore, a barrier layer 33 may optionally be produced onto the sidewalls and the bottom of the trench prior to the deposition of the electrode layer.

Figure 6A:
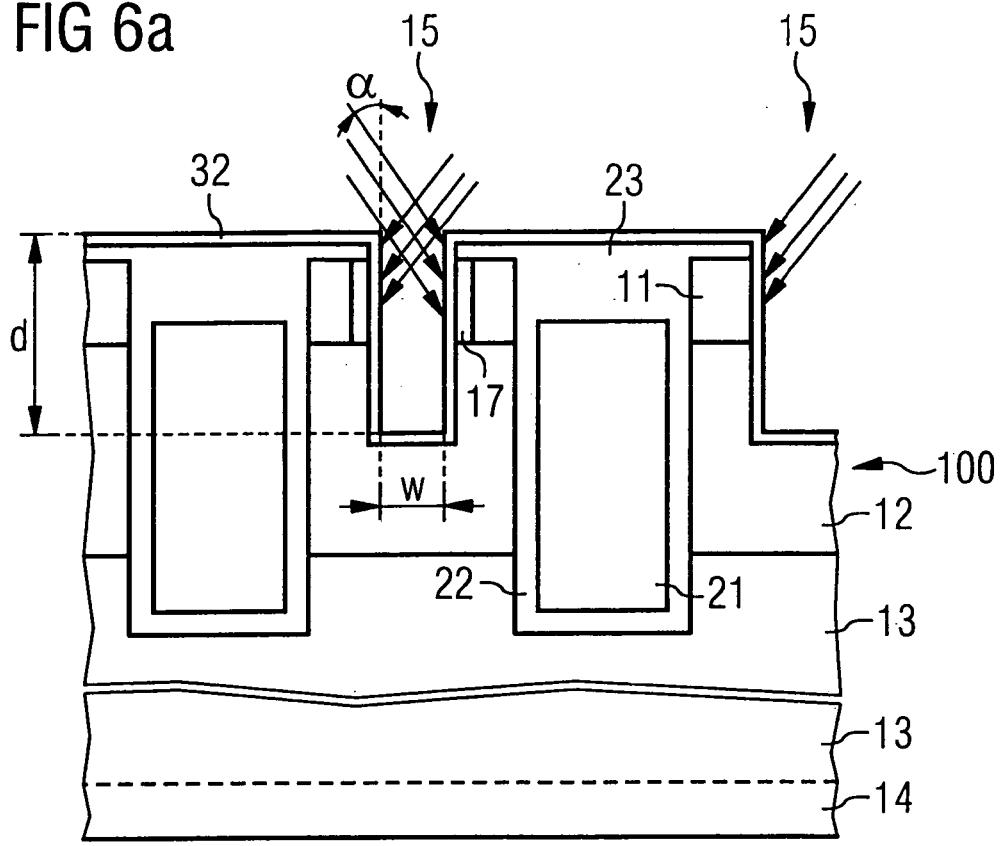
FIG. 6 illustrates, on the basis of cross-sectional illustrations of a semiconductor body having a first and second semiconductor zone to be contact-connected, a method for producing a connection electrode for these two semiconductor zones in which connection zones are produced in the two semiconductor zones by means of implantation steps employing different implantation angles.
Figure 6B:
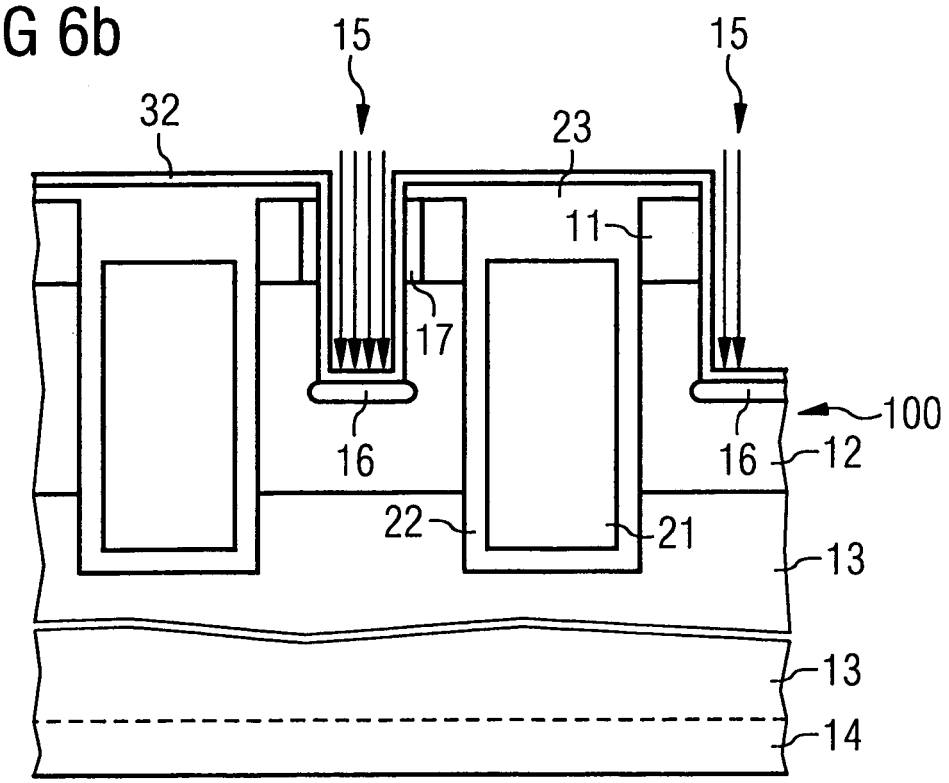

A further alternative of a method for producing a connection electrode which makes contact with the first and second semiconductor zones 11, 12 is explained below with reference to FIGS. 6a to 6c. Referring to FIGS. 6a and 6b, this method provides for implanting dopant atoms of the first conduction type via the sidewalls 151 of the trench 15 into the first semiconductor zone 11 and dopant atoms of the second type via the bottom 152 of the trench into the second semiconductor zone, in order thereby to produce a highly doped connection zone 17 of the same conduction type as the first semiconductor zone 11 in said semiconductor zone 11 and to produce a highly doped connection zone of the same conduction type as the second semiconductor zone in said second semiconductor zone 12. For carrying out these implantation steps, a screen oxide 32 is preferably applied at least to the sidewalls 151 and the bottom of the trench 152.

In order to ensure that the dopant atoms of the first type for the production of the connection zone 17 are essentially introduced only into the first semiconductor zone II, an implantation angle at which the dopant atoms are implanted is chosen such that no dopant atoms can pass as far as the trench bottom 152. In this case, given a suitable implantation angle, the upper edges of the trench 15 shield the trench bottom against an implantation of dopant atoms of the first type. Given a trench depth d and a trench width w, the following holds true for the smallest angle a at which the dopant atoms are still just permitted to be implanted relative to the vertical so as not to pass as far as the trench bottom:

$\alpha = \arctan(w/d)$

When a screen oxide 32 is provided, d designates the trench depth still present after the application of the screen oxide, while w designates the width of the trench that is present after the application of the screen oxide 32.

In order to avoid an implantation of dopant atoms into the bottom of the trench, the sidewall implantation is thus effected at angles which are less than the limiting angle α specified in equation 1.

The production of the connection zone 16 below the trench bottom 152 is effected by implantation of dopant atoms at an angle of 0° relative to the vertical, that is to say relative to the trench sidewalls 151, or at an angle of 90° relative to the trench bottom. This implantation prevents dopant atoms from being implanted into the first semiconductor zone 11 via the sidewalls 151 of the trench.

It generally holds true that, in the case of the method explained above, the limiting angle α—and thus the angles at which the dopant atoms of the first type for the production of the connection zone 17 are permitted to be implanted—may be smaller, the higher the aspect ratio of the trench, that is to say the ratio of trench width to trench depth. Whereas in the case of an aspect ratio of 1:1 the implantation angle should lie between 45° and 60° in order to ensure that no dopant atoms are implanted into the bottom of the trench, in the case of an aspect ratio of 3:1 angles of between 20° and 45° already suffice to ensure this.

The implantation methods are followed by the method steps already explained above for producing the connection electrode, in which case a screen oxide 32 that was possibly applied is removed prior to the production of said connection electrode.

Figure 6C:
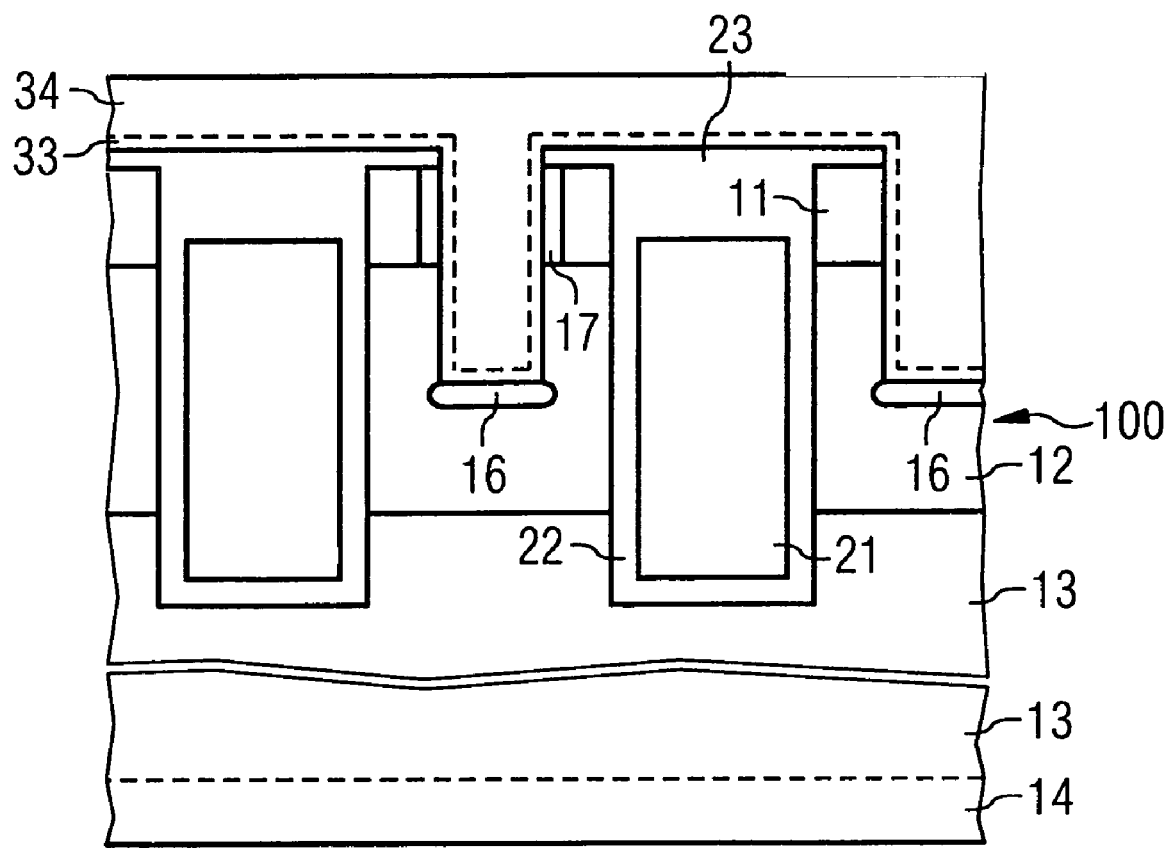

FIG. 6c shows the component after the method steps for producing the connection electrode 34 have been carried out, a barrier layer 33 optionally being applied at least to the sidewalls and to the bottom of the trench 15 prior to the deposition of the electrode layer for producing the connection electrode.

A possible method for producing the trench 15 that extends into the semiconductor body 100 proceeding from the front side 101 for the later connection electrode is explained below with reference to FIGS. 7a to 7e.

Figure 7A:
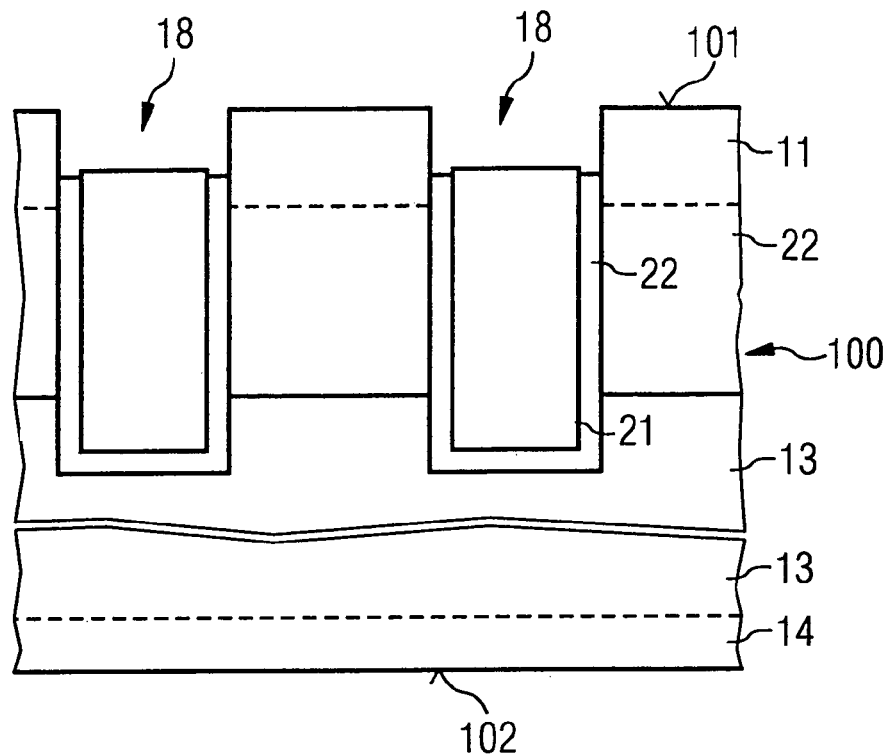
FIG. 7 illustrates, on the basis of cross-sectional illustrations of a semiconductor body, a method for producing the trench for the connection electrode using a spacer produced by oxidation.

FIG. 7a shows the semiconductor body 100 in side view in cross section after the performance of method steps for producing the gate electrodes 21 arranged in trenches and the gate dielectric layers 22 which dielectrically insulate the gate electrodes 21 from the semiconductor body 100 and after the production of the second semiconductor layer 12. Said second semiconductor layer 12 is produced for example by implanting dopant atoms of the second conduction type via the front side 101 into the semiconductor body 100 and subsequently carrying out a thermal treatment. In this case, the first semiconductor zone 11 may be produced in a manner corresponding to the second semiconductor zone by implantation of dopant atoms and a subsequent thermal treatment directly after the production of the second semiconductor zone 12, but may—as will be explained below—also be produced at a later point in time in the method.

In this arrangement, the gate electrodes 21 are realized in such a way that an upper end of the gate electrodes 21 is recessed relative to the front side 101 of the semiconductor body 100, with the result that cut-outs 18 are in each case present above the gate electrodes 21 in the semiconductor body 100.

Figure 7B:
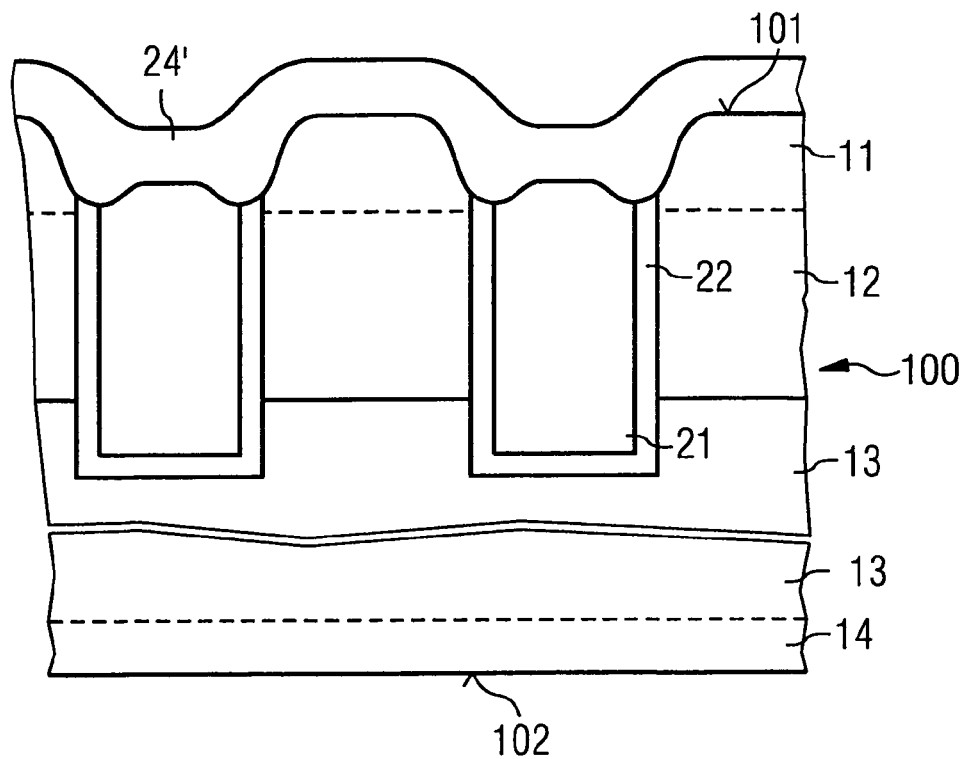

Referring to FIG. 7b, the arrangement illustrated in FIG. 7a is subjected to a thermal treatment, resulting in the oxidation of sections of the semiconductor body 100 and of the gate electrodes 21 that are near the surface, as a result of which an oxide layer 24' arises in the region of the front side 101 both above sections of the semiconductor body 100, in particular above the mesa regions, and above the gate electrodes 21. The gate electrodes 21 comprise doped polysilicon, for example, and thus oxidize approximately at the same temperatures as the semiconductor body 100, comprising silicon for example.

A thickness of the oxide layer is between 200 and 300 nm, for example, for which a layer of the semiconductor body near the surface with a thickness of approximately 100 to 150 nm is "consumed". In this case, the oxidation of the semiconductor body 100 is effected both at the front side 101 and in those regions which are uncovered laterally at the cut-outs 18 above the gate electrodes 21. This oxidation of the front side 101 and of the sidewalls of the cutouts has the effect that the oxide layer 24' runs in a funnel-shaped or V-shaped manner above the gate electrodes 21. The oxidation layer 24', which grows everywhere on uncovered regions of the semiconductor body 100 and of the gate electrodes 21, due to the cut-outs 18 above the gate electrodes 21, thereby has an uneven surface structure with depressions above the gate electrodes 21.

Figure 7C:
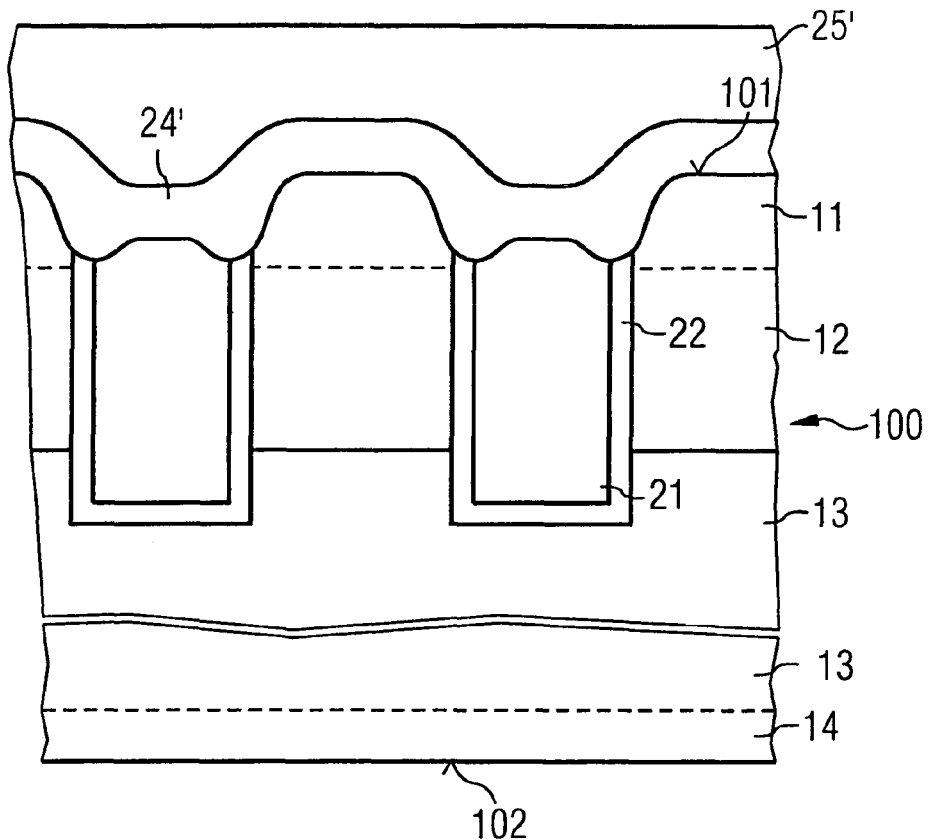
Figure 7D:
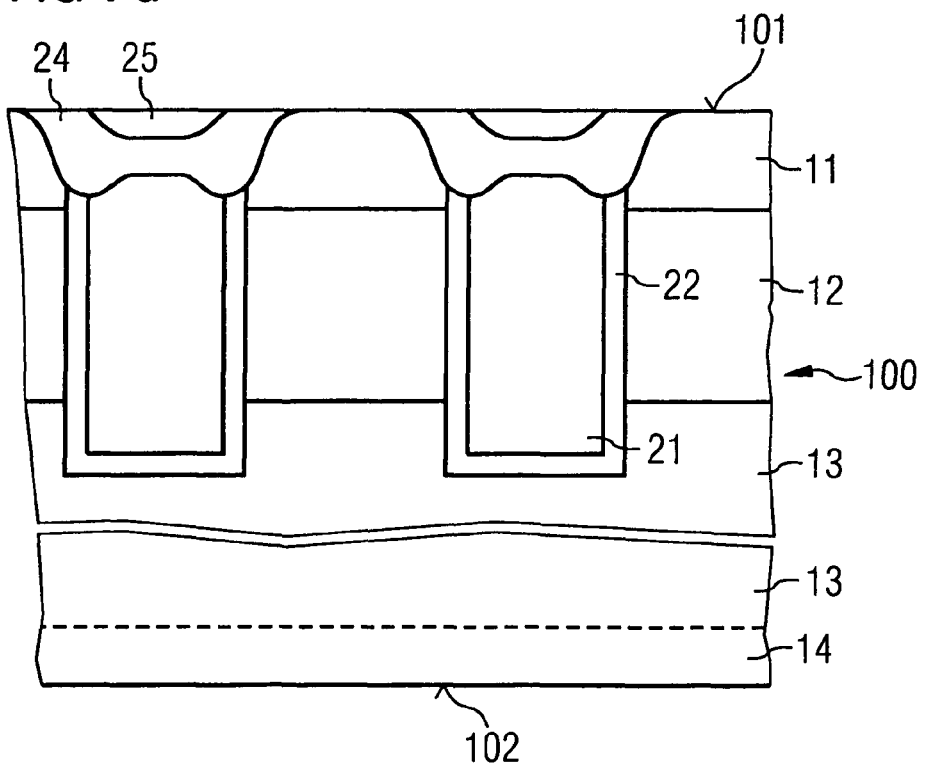
Figure 7E:
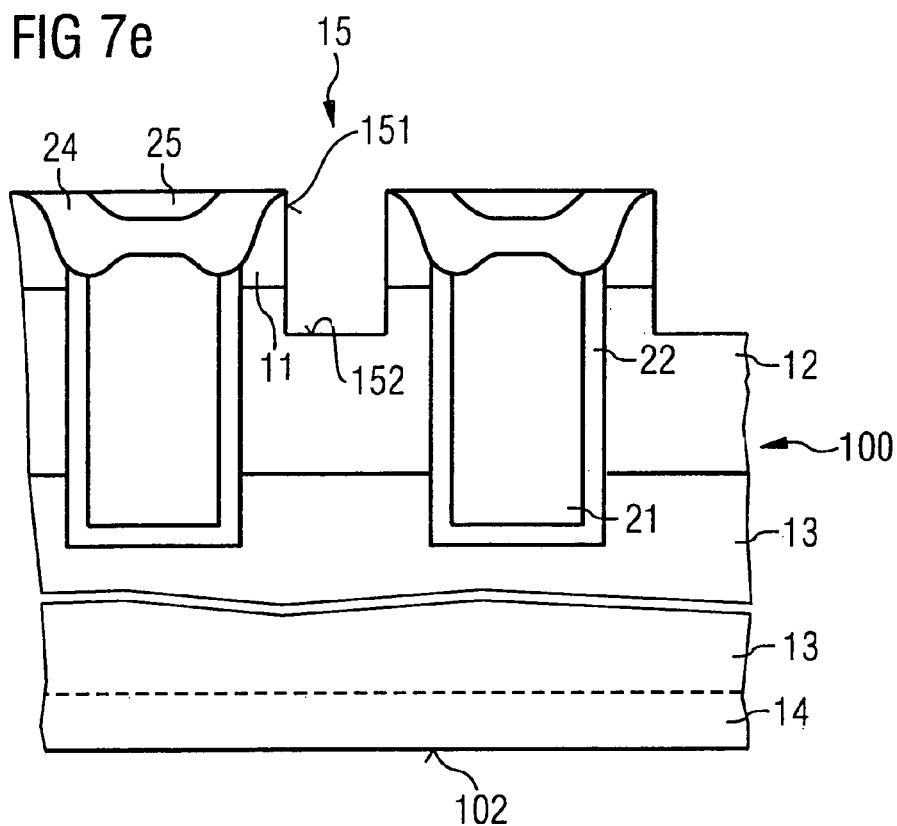

Referring to FIG. 7c, a filling layer 25' is subsequently applied to the oxide layer 24', and fills the cut-outs of the oxide layer 24'. Said filling layer 25' comprises for example an insulation material, for example a deposited oxide, such as tetraethoxysilane (TEOS), or a doped or undoped silicate glass (PSG, BPSG, USG).

Said filling layer 25' and the oxide layer 24' are subsequently removed until the mesa region of the semiconductor body 100 that is situated between the trenches having the gate electrodes 21 is uncovered, which is illustrated as the result in FIG. 7b. These two layers are removed for example by means of a chemical mechanical polishing method (CMP) or by means of an etching method. In this case, the oxide layer 24' and the filling layer 25' remain in sections in the region of the earlier cut-outs (18 in FIG. 7a) of the semiconductor body 100 above the gate electrodes 21. It should be noted in this connection that the filling layer 25' essentially serves for completely filling said cut-outs above the gate electrodes 21. The deposition of said filling layer 25' may be dispensed with when a thickness of the oxide layer 24' is chosen such that the latter already fills the cut-outs as far as the front side 101 of the semiconductor body 100, that is to say if a surface of the oxide layer 24' in a region above the gate electrodes 21, in the vertical direction, is situated higher than the front side 101 of the semiconductor body 100 in the region of the mesa region.

Sections 24, 25 of the oxide layer 24' and of the filling layer 25' that remain after the removal process has been carried out form "plugs" of insulation material above the gate electrodes 21, said "plugs" widening in the direction of the front side 101 of the semiconductor body. If the first semiconductor zone 11 has not already been produced after the production of the second semiconductor zone 12, said first semiconductor zone can be implemented by employing an implantation and thermal process after the production of the insulation plugs 24, 25.

An etching method is subsequently carried out using said insulation plugs 24, 25 as a mask, by means of which etching method a trench 15 extending through the first semiconductor zone 11 right into the second semiconductor zone 12 proceeding from the front side 101 is etched into the mesa region. The etching method is an anisotropic etching method that removes the semiconductor material exclusively in the vertical direction of the semiconductor body 100. In this case, the dimensions of the trench 15 in the lateral direction are determined by the mutual spacings of insulation plugs 24, 25 in the lateral direction in the region of the front side 101 of the semiconductor body 100. Since the insulation plugs widen in the direction of the front side 101 of the semiconductor body and thus in the lateral direction go beyond the dimensions of the trenches having the gate electrodes 21 arranged therein, said insulation plugs 24, 25 act as spacers between the trenches having gate electrodes 21 and the trench 15 produced by the anisotropic etching for the later connection electrode. In this case, the distance between the trenches having the gate electrodes 21 and the trench 15 for the connection electrode is essentially determined by the thickness of the oxide layer 24.

In order to ensure that a highly doped first connection zone (16 in FIGS. 1 to 6) produced below the trench bottom 152 in the second semiconductor zone 12 is at a sufficiently large distance in the lateral direction from the gate dielectric 22, so that said connection zone does not influence the channel properties of the MOS transistor, it is desirable to make the distance between the trench having the gate electrode 21 and the trench 15 for the connection electrode as large as possible. In the case of the method for producing said trench 15 explained above with reference to FIG. 7, however, said distance is limited by the thickness of the oxide layer 24', which cannot be realized with an arbitrary thickness in order to limit mechanical stresses in the component structure, which increase as the thickness of the oxide layer 24' increases.

One possibility for setting the distance between the highly doped connection zone in the second semiconductor layer 12 and the gate dielectric 22 in the lateral direction independently of the distance between the trench 15 and the trench having the gate electrode 21 consists in producing the connection zone 16 using the method explained with reference to FIG. 3. In this method, a protective layer 41 is applied to sidewalls of the trench 15, which protective layer limits the implantation region at the trench bottom 152 in the lateral direction when carrying out the implantation method for producing the connection zone 16.

A further method for producing a highly doped connection zone in the second semiconductor layer 12, which makes it possible to set the distance between said connection zone and the trench having the gate electrode 21 independently of the distance between the trench having the gate electrode 21 and the trench 15 for the connection electrode, is explained below with reference to FIGS. 8a to 8c.

Figure 8A:
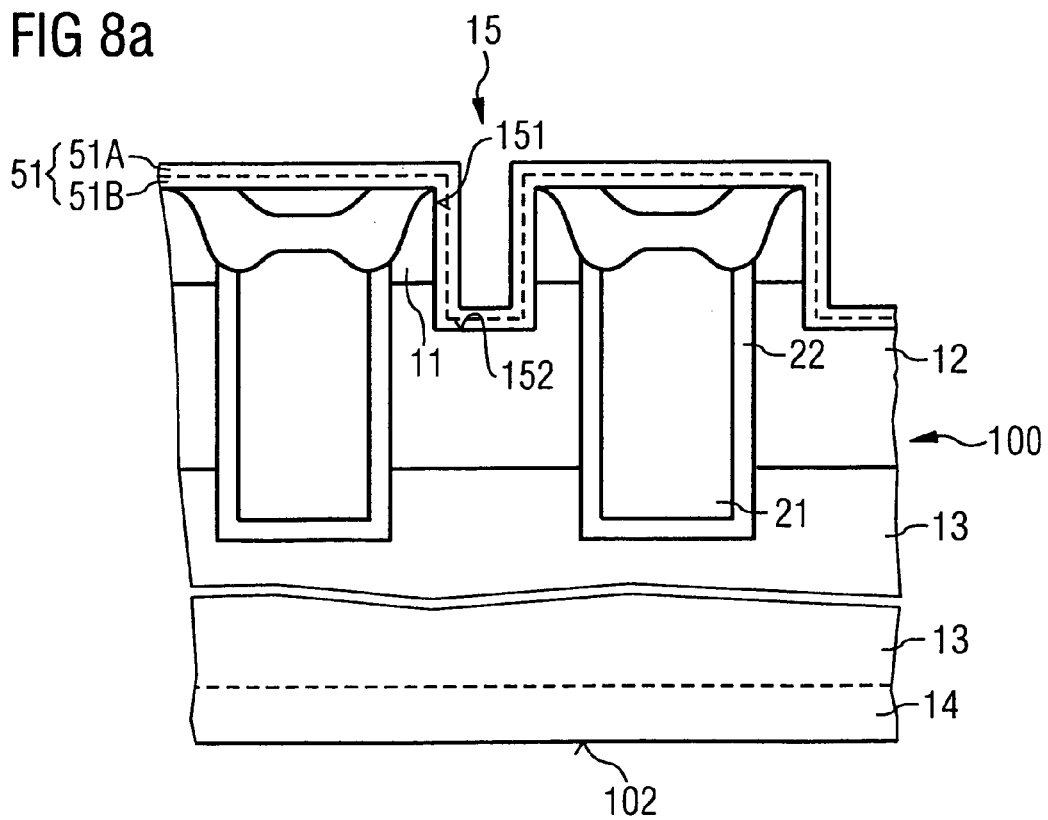
FIG. 8 illustrates a further method for producing a connection zone.

Referring to FIG. 8a, this method involves firstly producing a spacer layer 51, which is deposited onto the component arrangement over the whole area, by way of example. Said spacer layer 51 is for example a layer made of a deposited oxide (TEOS) or a nitride layer. Furthermore, said spacer layer 51 may also have a plurality of partial layers, for example an oxide layer 51A deposited first and a nitride layer SIB deposited afterward, which is illustrated in dashed fashion in FIG. 8a.

Figure 8B:
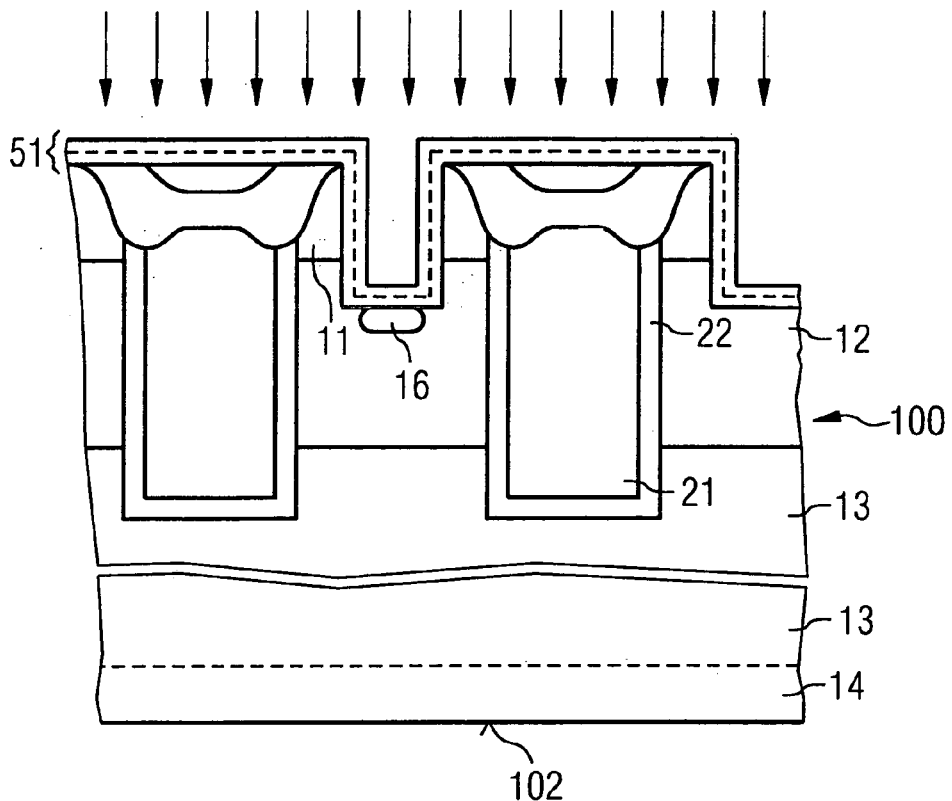

Referring to FIG. 8b, an implantation method is subsequently carried out, by means of which dopant atoms of the second conduction type are implanted through the spacer layer 51 via the trench bottom 152 into the second semiconductor layer 12. In this case, the insulation plugs 24, 25 prevent an implantation of dopant atoms into regions of the semiconductor body which are arranged adjacent to the trench 15 in the lateral direction. At the sidewalls 151 of the trench I5, the spacer layer 51 prevents an implantation of dopant atoms of the second conduction type into the first semiconductor layer 11. While the dopant atoms in the region of the trench bottom 152 penetrate through the spacer layer perpendicularly, dopant atoms in the region of the sidewalls 151 of the trench can impinge on the spacer layer 51 at most at a very shallow angle at which, however, they cannot penetrate through the spacer layer 51. Consequently, in this method, the spacer layer 51 acts as a protective layer that prevents doping of the mesa region in the region of the sidewalls 151 of the trench 15. The spacer layer furthermore limits the implantation region, that is to say the region in which dopant atoms are implanted, in the lateral direction in the region of the trench bottom 152. In this case, the thickness of the spacer layer 51 serves for setting the distance between said implantation region, and thus the highly doped connection zone 16 produced by the implantation, and the trench having the gate electrode 21.

Figure 9:
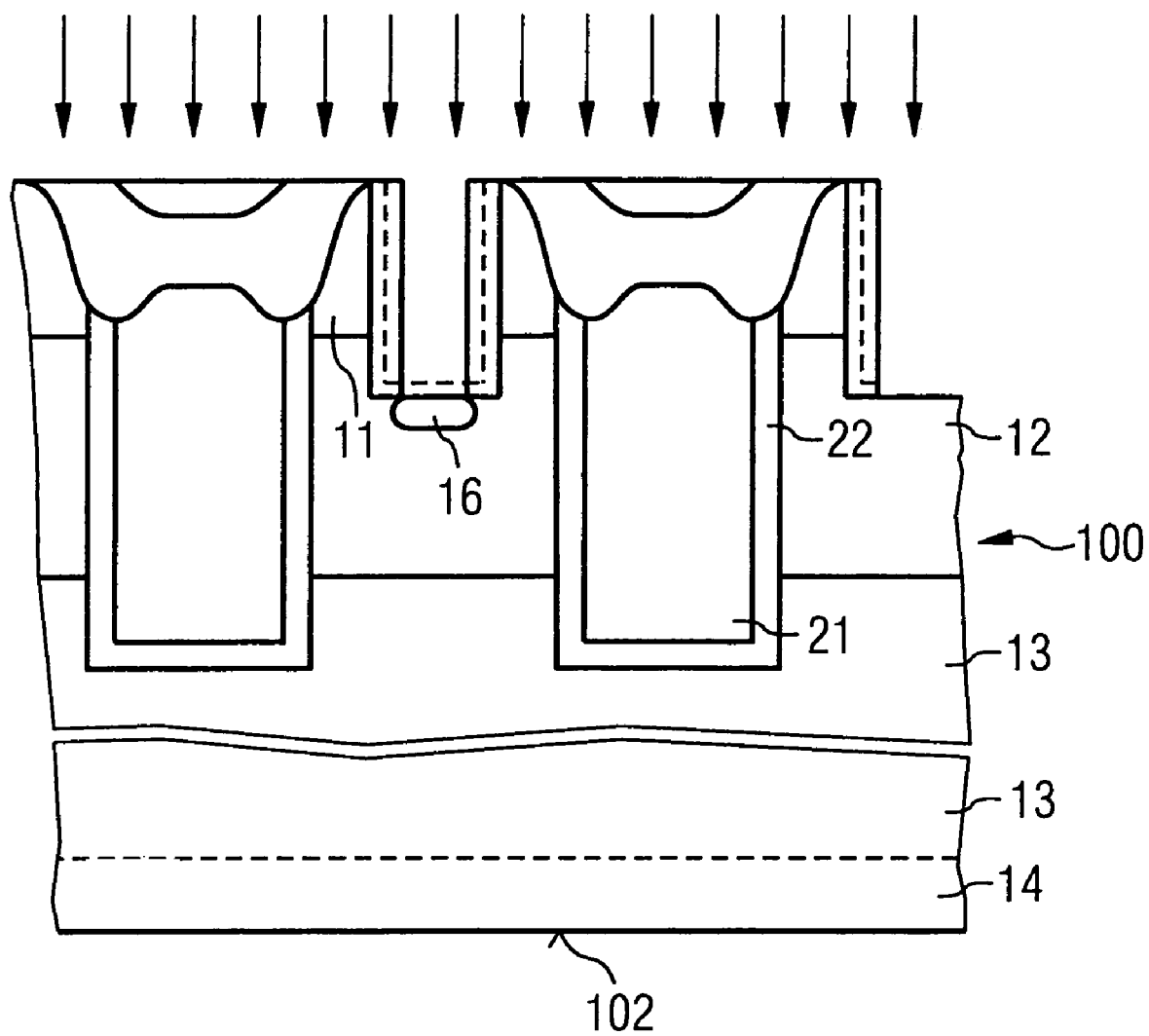
FIG. 9 illustrates a modification of a method step of the method elucidated with reference to FIG. 8.

For setting the distance between the highly doped connection zone 16 and the gate electrode 21, it suffices to produce the spacer layer 51 at the sidewalls 151 of the trench 15. Referring to FIG. 9, there is optionally the possibility, therefore, of anisotropically etching back the spacer layer 51, that is to say removing it from the trench bottom 152, in particular, prior to carrying out the implantation method.

Figure 8C:
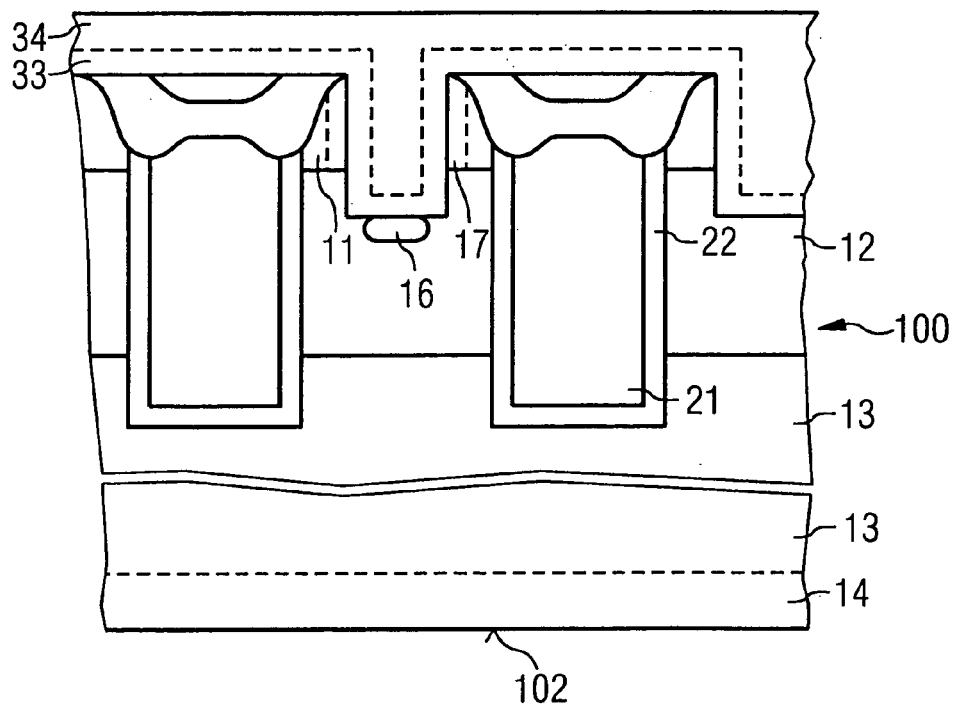

Referring to FIG. 8c, which shows the component structure after further method steps have been carried out, the spacer layer 51 is removed after the production of the highly doped connection zone 16 and the trench 15 is filled with an electrode material for producing the connection electrode in the manner already explained, in which case, in the manner already explained, said connection electrode may have two partial layers, namely a barrier layer 33 and an electrode layer 34. There is optionally the possibility of producing a highly doped connection zone 17 in the first semiconductor layer 11 prior to producing the connection electrode 33, 34. Said highly doped connection zone 11 may be produced for example by means of an implantation—explained with reference to FIG. 6a—of dopant atoms of the first conduction type at an angle inclined relative to the perpendicular.

The invention claimed is:

1. A method for producing a connection electrode for a first semiconductor zone and a second semiconductor zone, which are arranged one above another and are doped complementarily with respect to one another, the method comprising:
producing a trench extending through the first semiconductor zone and into the second semiconductor zone in such a way that the first semiconductor zone is uncovered at sidewalls of the trench and the second semiconductor zone is uncovered at least at a bottom of the trench,
applying a protective layer to a first one of the first and second semiconductor zones in the trench, such that it leaves a second one of the first and second semiconductor zones within the trench at least partly uncovered
producing a first connection zone in the second one of the first and second semiconductor zones that is at least part uncovered by the protective layer, by introducing dopant atoms using an implantation process into the second one of the first and second semiconductor zones via the trench, the first connection zone being of the same conductivity type as, and doped more highly than, the second one of the first and second semiconductor zones,
depositing an electrode layer at least onto the sidewalls and the bottom of the trench for the purpose of producing the connection electrode, and
wherein the protective layer substantially prevents dopant atoms from being implanted into the first one of the first and second semiconductor zones during the implantation process used to form the first connection zone.

2. The method as claimed in claim 1, wherein the protective layer is a layer containing dopant atoms, and wherein the first and second semiconductor zones are heated to a predetermined temperature for a predetermined time duration, such that dopant atoms indiffuse from the protective layer into the first one of the first and second semiconductor zones, forming a second connection zone which is of the same conductivity type as, and doped more highly than, said first one of the first and second semiconductor zones.

3. The method as claimed in claim 1, wherein the first connection zone is produced by implanting dopant atoms and subsequently carrying out a thermal step.

4. The method as claimed in claim 1, wherein the protective layer is a layer made of a dielectric material which is removed prior to the production of the connection electrode.

5. The method as claimed in claim 1, wherein the protective layer is an electrically conductive layer to which the electrode layer is applied.

6. The method as claimed in claim 1, wherein the protective layer is a layer containing dopant atoms, and in which the first and second semiconductor zones are heated to a predetermined temperature for a predetermined time duration, so that the dopant atoms indiffuse from the protective layer into the first one of the semiconductor zones and form a second connection zone.

7. The method as claimed in claim 1, wherein, prior to the production of the electrode layer, a barrier layer is applied to the sidewalls and the bottom of the trench.

8. The method as claimed in claim 1, in which the protective layer is an oxide layer or a nitride layer.

9. The method as claimed in claim 1, in which the protective layer has a first partial layer made of an oxide and a second partial layer made of a nitride.

10. The method as claimed in claim 3, wherein, prior to carrying out the implantation, a screen layer is applied to the sidewalls and the bottom of the trench.

11. The method as claimed in claim 5, in which the protective layer comprises a metal, and in which the first and second semiconductor zones are heated to a predetermined temperature for a predetermined time duration, so that the protective layer forms a metal-semiconductor compound.

* * * * *